(12) United States Patent  (10) Patent No.: US 7,667,316 B2
Fukamizu et al.  (45) Date of Patent: Feb. 23, 2010

(54) SEMICONDUCTOR INTEGRATED CIRCUIT AND METHOD FOR MANUFACTURING THE SAME

(75) Inventors: Shingo Fukamizu, Osaka (JP); Yutaka Nabeshima, Osaka (JP); Takashi Katsuyama, Shiga (JP)

(73) Assignee: Panasonic Corporation, Osaka (JP)

( * ) Notice: Subject to any disclaimer, the term of this patent is extended or adjusted under 35 U.S.C. 154(b) by 252 days.

(21) Appl. No.: 11/976,963

(22) Filed: Oct. 30, 2007

(65) Prior Publication Data

US 2008/0099783 A1    May 1, 2008

(30) Foreign Application Priority Data

Oct. 31, 2006  (JP) .............................. 2006-295689
Dec. 1, 2006   (JP) .............................. 2006-325465

(51) Int. Cl.
  *H01L 23/49*  (2006.01)
  *H01L 21/44*  (2006.01)
(52) U.S. Cl. ....................... 257/691; 257/177; 257/784; 257/E23.024; 257/E21.476; 438/612
(58) Field of Classification Search ................. 257/177, 257/784, 773, 691, 379, 203, E21.507, E21.506, 257/E21.615, E21.627, E21.476, E23.024
See application file for complete search history.

(56) References Cited

U.S. PATENT DOCUMENTS

2002/0011674 A1   1/2002   Efland et al.

FOREIGN PATENT DOCUMENTS

| JP | 2974022 | 9/1999 |
| JP | 2000-114309 | 4/2000 |
| JP | 2004-363340 | 12/2004 |
| JP | 3725527 | 9/2005 |

OTHER PUBLICATIONS

U.S. Appl. No. 11/945,605, filed Nov. 27, 2007, Fukamizu et al.
U.S. Appl. No. 11/946,282, filed Nov. 28, 2007, Fukamizu et al.
U.S. Appl. No. 12/038,060, filed Feb. 27, 2008.

*Primary Examiner*—Victor A Mandala
*Assistant Examiner*—Whitney Moore
(74) *Attorney, Agent, or Firm*—McDermott Will & Emery LLP

(57) ABSTRACT

A semiconductor integrated circuit includes a power transistor formed on a semiconductor substrate, a plurality of first metal patterns and a plurality of second metal patterns which are formed right above the power transistor and function as a first electrode and as a second electrode of the power transistor, respectively, a plurality of first buses each electrically connected with, of a plurality of first metal patterns, a corresponding first metal pattern, a plurality of second buses each electrically connected with, of a plurality of second metal patterns, a corresponding second metal pattern, wherein one contact pad is provided to each of a plurality of first buses and a plurality of second buses.

21 Claims, 15 Drawing Sheets

FIG. 1
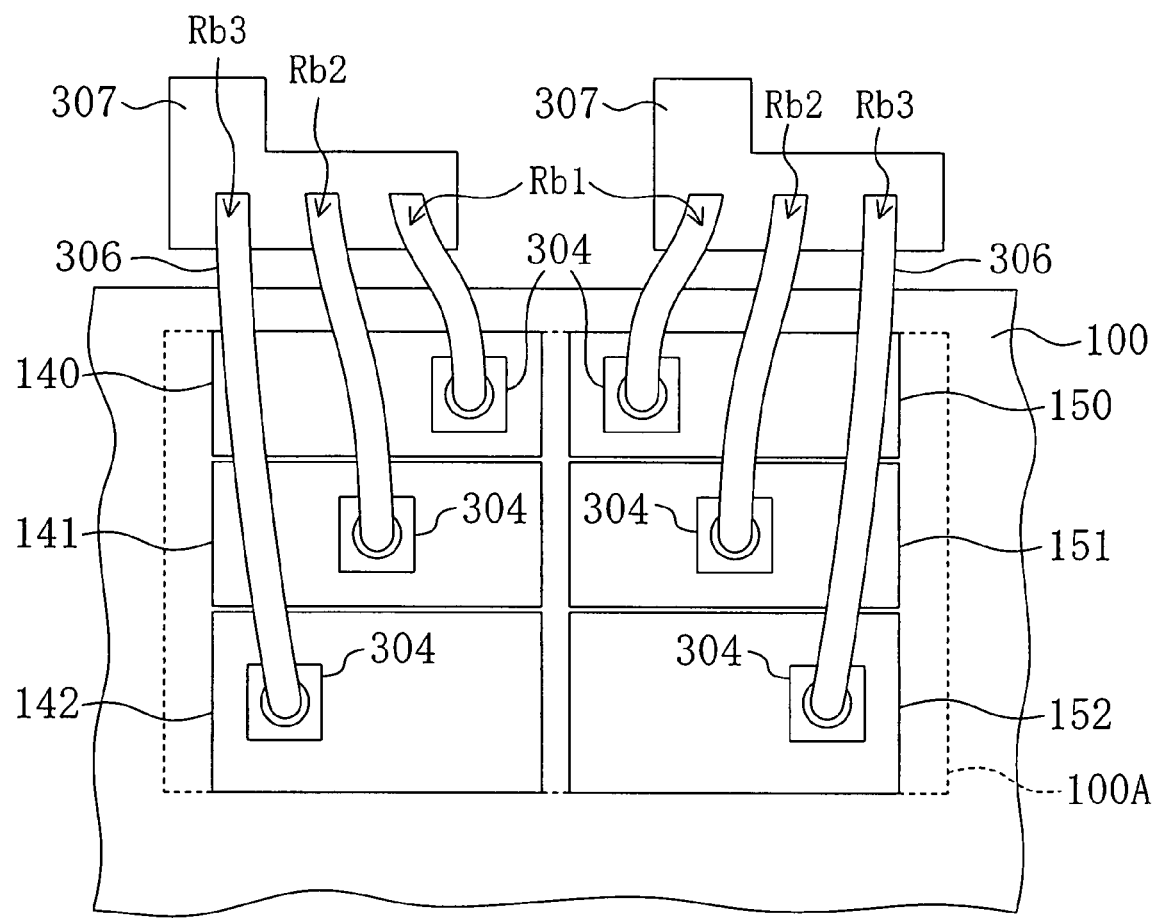
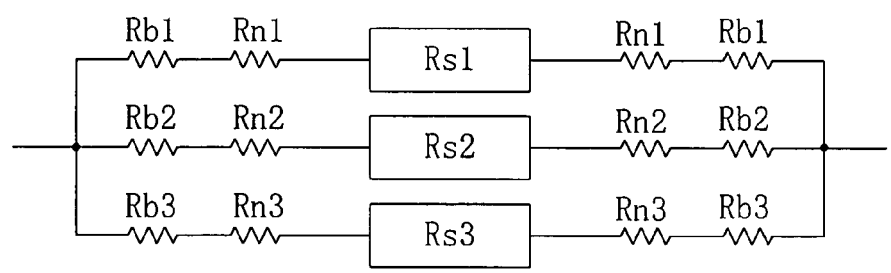

FIG. 3
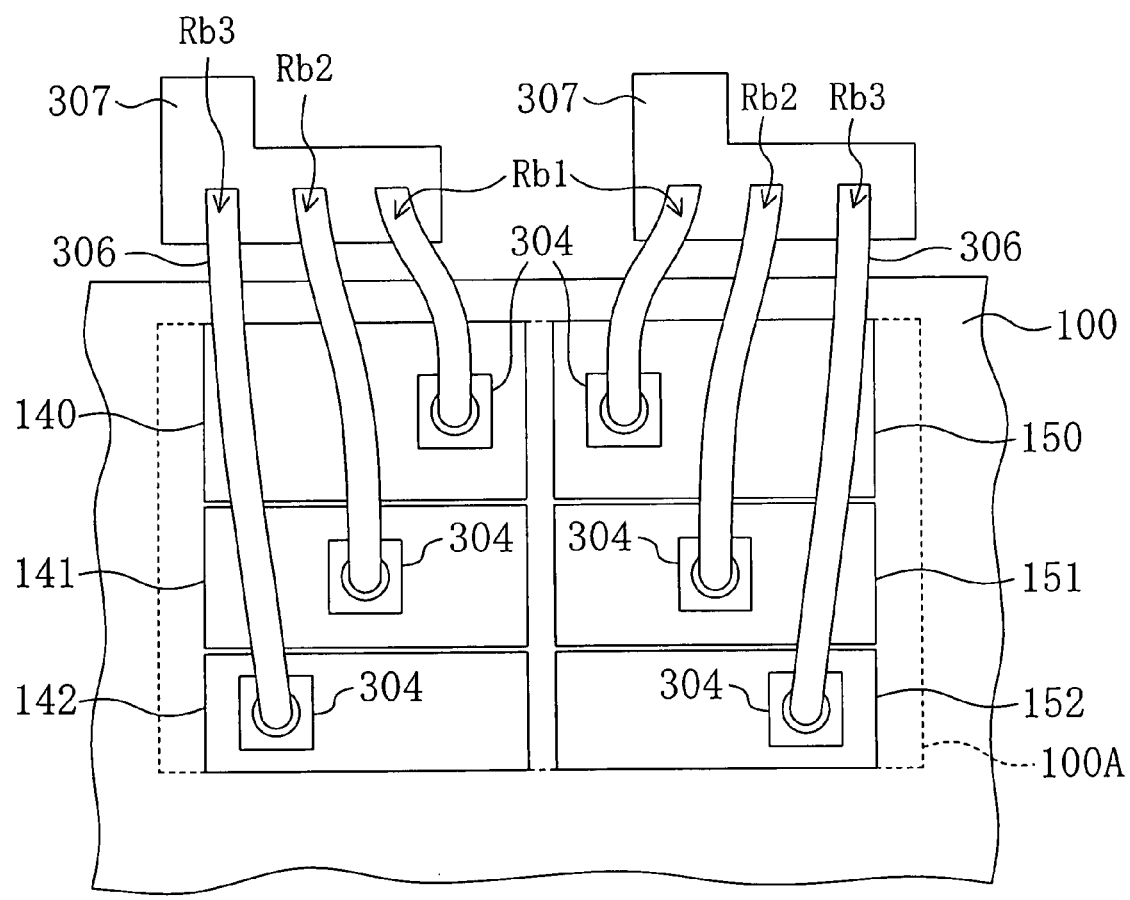
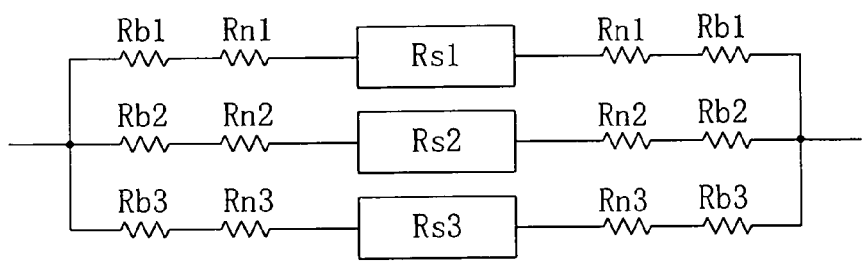

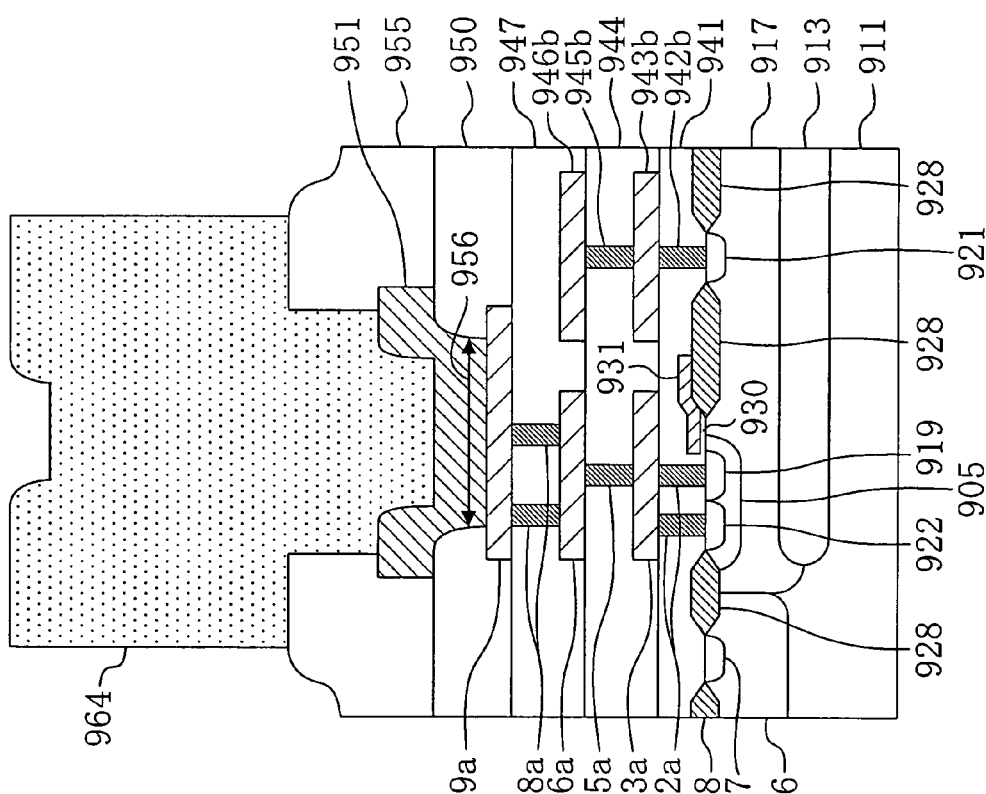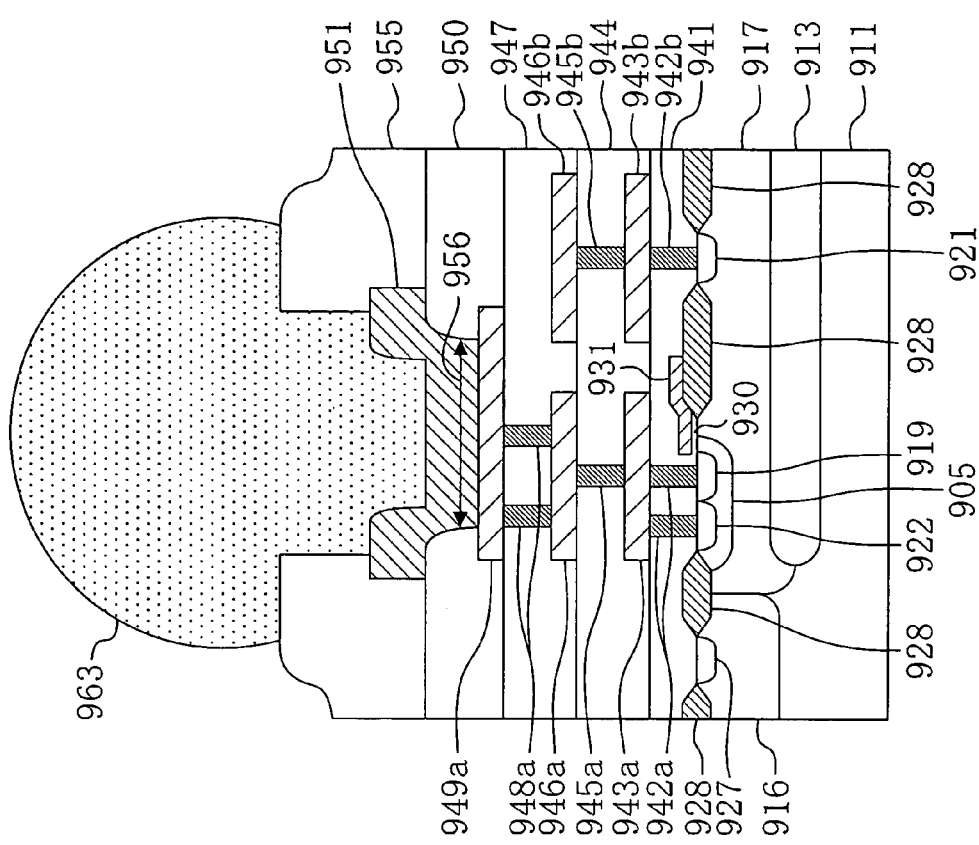

FIG. 15
PRIOR ART
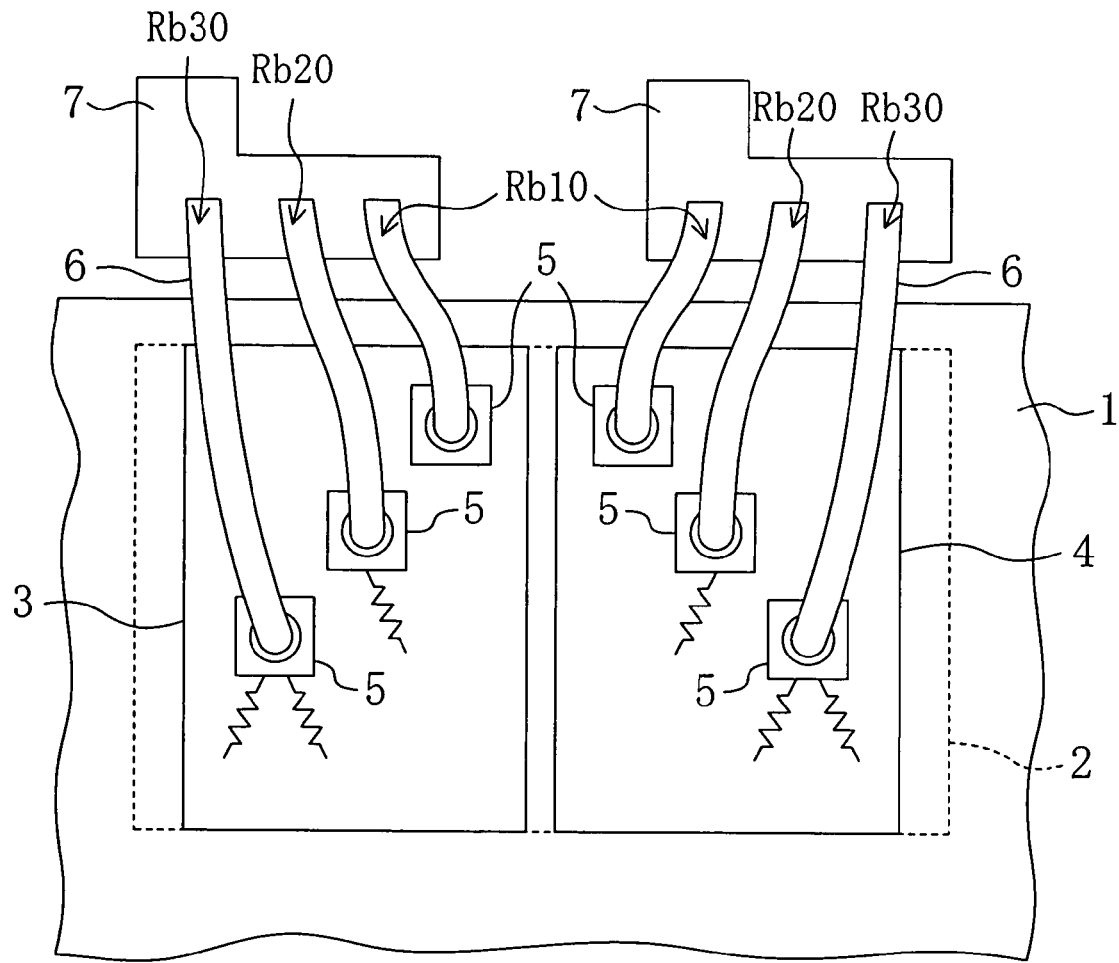
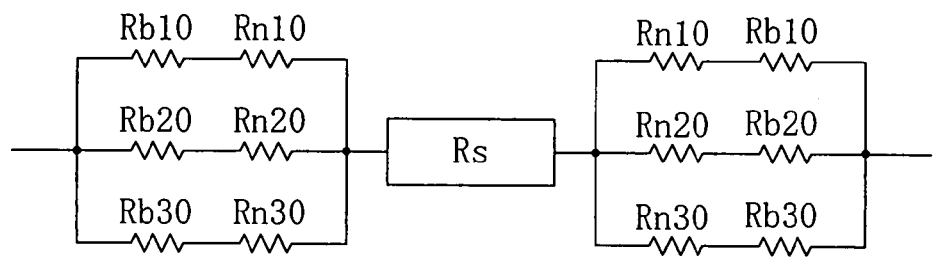

SEMICONDUCTOR INTEGRATED CIRCUIT AND METHOD FOR MANUFACTURING THE SAME

BACKGROUND OF THE INVENTION

The present invention relates to a semiconductor integrated circuit and a method for manufacturing the same, and in particular, to a power integrated circuit having a structure which enables execution of wire bonding right above an active circuit region by utilizing POE (Pad on Element), namely, a pad is provided right above a semiconductor apparatus, and to a method for manufacturing the power integrated circuit.

In recent years, together with widespread use of information technology, needs for speeding up and low power consumption have been increasing to be developed as capabilities of electronic equipment such as computers, information storage devices, cellular phones, and portable cameras.

As factors which have significant influences on performances of such electronic equipment, there are core semiconductor electronic parts such power supplies, motor drivers, and audio amplifiers. As what has significant influences on performance of these semiconductor parts, there are power integrated circuit incorporating power devices. Therefore, for performance of semiconductor elements constituting the power integrated circuits, requests for further speeding up and lower power consumption have been becoming remarkable.

In the meantime, as general market requests, in addition to the above-mentioned speeding up and low power consumption, major improvements of power devices and circuit characteristics are desired. Also there are many requests and various proposals for low-cost and reliable structure and method which are enabled by formation of bond of wires and solder balls on right above the active circuit region.

Hereafter, first, conventional technology used before introduction of POE technology, namely, a technology by which a pad is provided right above the semiconductor device, will be explained briefly.

A member connecting a pad and an external lead frame is a bonding wire. As materials used for the bonding wire, pure or alloy gold, copper, and aluminum are exemplified. When gold is used as the material, the diameter of the bonding wire normally used is in a range from approximately 20 to 50 µm, and for wire ball bonding, a ball is normally mounted to a chip. Accordingly, when a ball is crushed into a typical nail-head profile by a bonding capillary at bonding work, the area of the pad should be large enough to enable securement of the ball. Since diameter of the ball in free state is typically in a range from approximately 1.2 to 1.6 times the wire diameter, the profile of a contact pad should be a square in a range from approximately 50×50 µm to 150×150 µm depending on process parameters. Further, when a solder ball is used for a connecting member, ball diameter is typically in a range from approximately 0.2 to 0.5 mm, while diameter of the contact pad should be such that the profile has an area from approximately 0.3 to 0.7 mm. Here, the expression "solder ball" does not necessarily mean that the solder contact is spherical, but diversified profiles including semispherical, half dome, cut conical shape or ordinary bump may be used. A specific profile depends on deposition technology, reflow technology, and material composition.

Further, contact pads are normally disposed in essentially straight array along with circumference of the chip, thereby consuming large area "silicon resources" (chips are predominantly produced on a substrate made of silicon semiconductor material). Recent semiconductor circuits require a large number of contact pads, and the number could reach frequently several hundreds even with ground connection and power connection alone. If signal connection is included, over 1000 contact pads are necessary, thereby sacrificing a large amount of precious silicon resources.

Further, it is known from over several years of experience that wire bonding process exerts a sizable stress to a layer under the metal and dielectric body. Causes for this are impact of bonding capillary (nail-headed contact is formed by crushing a golden ball), frequency and energy of supersonic vibration of bonding capillary and golden ball (oxidized aluminum film on the surface of exposed metal layer is broken), and time and temperature of the process (to initiate formation of intermetal compound of gold/aluminum deposition). In order to avoid risks for generation of cracking or crater to a layer under the bonding pad due to stress during wire bonding process or stress given by device actuation after multiprobe test and assembly, design rules relating to layout of semiconductor integrated circuits, which prohibit circuit structure disposed in the region under the bonding pad and avoid the use of dielectric body materials which are easily damaged and are mechanically weak, are established in the past several years. For this reason, a large quantity of silicon resources is necessary to provide the bonding pad alone.

Against such a background, requests for speeding up and low power consumption of semiconductor integrated circuits as mentioned above are increasing together with substantial improvements of power device and circuit characteristics, and requests for low-cost and reliable structure and method which are enabled by formation of bond of wires and solder balls on right above the active circuit region.

—Speeding Up of Semiconductor Integrated Circuits—

First, factors which disturb speeding up of semiconductor integrated circuits are delay in a MOS transistor itself and wiring delay by wirings located at an upper layer thereon. Conventionally, delay in a MOS transistor itself was reduced by fine technology which made the gate length shorter. However, as delay in a MOS transistor itself is made smaller, problems associated with wiring delay are becoming outstanding accordingly.

In view of this, for the purpose of reducing inter-wiring delay, it is attempted to employ an insulation film (low-dielectric constant film) with low dielectric constant to the insulation film sandwiched between wirings. However, with low-dielectric constant film which realizes dielectric constant less than 3.0, mechanical strength is greatly reduced compared to a conventionally used silicon oxidized film, thus posing problems in assembly step responsible for packaging of semiconductor integrated circuits, especially in the wire bonding step, upon completion of the diffusion step responsible for circuit formation of semiconductor integrated circuits.

Specifically, since mechanical strength of an interlayer insulation film is not sufficient, if wire bonding is performed on the pad mounted on the semiconductor integrated circuit, impact load of the wire bonding is conveyed to the interlayer insulation film right below the pad via the pad, thereby greatly deforming the interlayer insulation film. As a result, a crack is caused to the interlayer insulation film which results in poor reliability due to separation of the pad or separation of interlayer insulation film. Further in recent years, for the purpose of reducing costs by reducing dimensions of the semiconductor elements, a semiconductor element with a pad mounted on transistors constituting an active circuit region is developed. In this case, if a low-dielectric constant film with low mechanical strength is used between wirings or for the interlayer insulation film, the transistor is damaged due to that the low-dielectric constant film is deformed by impact of wire bonding and the impact can be easily conveyed to the transistor, thereby causing poor quality.

In the meantime, according to Patent Document 1 (Japanese Patent No. 2974022), a metal layer is formed right below the pad across an interlayer insulation film, the metal layer and the pad are connected by a via, an impact exerted to the interlayer insulation film by wire bonding is then received by the metal layer and at the same time, possible deformation of the metal layer in the impact exertion direction is supported by the via. Thus, according to Patent Document 1, damage to the transistor by wire bonding is suppressed by providing a pad structure which reduces mechanical strength of the interlayer insulation film formed right below the pad.

Incidentally, when copper is adopted as the metal material, copper wiring will be formed by damascene process. If area of copper pattern having soft nature is made greatly large, its center portion is scraped by CMP (Chemical Mechanical Polishing) performed for flattening of plated copper after electroplating of the copper, and its film thickness is made very thin; this is referred to as dishing. Further, to form a fine via pattern in the lower layer, if area of copper pattern is made greatly large by thinning of film thickness of the metal layer, the copper is scraped thoroughly by CMP at some portions.

In this regard, in Patent Document 1, at formation of a second metal layer, namely at copper formation, the above-mentioned phenomenon occurs. When the center portion of the copper pattern is made thinner or copper is scraped thoroughly as mentioned above, impact of wire bonding received by the interlayer insulation film is increased and possibility of crack generation increases.

Contrarily, according to Patent Document 2 (Japanese Patent No. 3725527), a pad structure which is capable of preventing damage due to wire bonding with regard to an insulation film right below the pad and transistor is provided. Namely, a semiconductor apparatus of the Patent Document 2 comprises a first electrode comprising a conductive layer, an external connection electrode comprising a conductive layer formed on the first electrode, and a second electrode of at least one layer connected via the first electrode and a through-hole to a lower part of the first electrode, and has many convex configurations at periphery of the second electrode.

In this way, with such a structure that a metal layer (hereafter referred to as the lower layer metal) sandwiched by an uppermost layer metal and the interlayer insulation film is connected by the via, it is possible to prevent deformation or crack of the low-dielectric constant film adopted between wirings right below the pad and to the insulation film between layers due to impact of wire bonding. In other words, since the uppermost layer metal is supported by the lower layer metal against impact of wire bonding, no deformation occurs even exposed to impact of wire bonding. As a result, impact of wire bonding conveyed to the low-dielectric constant film that serves as the interlayer insulation film right below the pad is suppressed, thereby preventing deformation or crack occurrence of the low-dielectric constant film.

Further, for the purpose of preventing dishing of CMP due to area enlargement of the lower layer metal, many convex configurations are provided at the periphery of the lower layer metal, surface area of the lower layer metal is then enlarged, adhesion with the interlayer film is enhanced, and hence damage to the transistors due to impact of wire bonding can be reduced and at the same time, crack occurrence to the interlayer insulation film can be prevented.

Thus, according to the pad structure employed in Patent Document 2, damage to the insulation film right below the pad and transistors due to wire bonding is prevented and this eventually contributes to speeding up of semiconductor integrated circuits.

—Lower Power Consumption of Semiconductor Integrated Circuits—

Next, what impairs lower power consumption attempt of semiconductor integrated circuits is realization of a power integrated circuit incorporating a power device while chip area is made as small as possible by utilizing miniaturization MOS process and thus effectively utilizing chip area of semiconductor products. For such power integrated circuit, for the purpose of realizing lower power consumption, Pulse Width Modulation (PWM) driving technology is normally used for driving of the power device. With the PWM driving, reduction in ON resistance of the power device is an important process technology which results in lower power consumption.

Patent Document 3 (US 20020011674A1) proposes conventional, related art by which ON resistance of the power device is reduced as much as possible by utilizing POE technology. Namely, in a power integrated circuit which enables wire bonding right above an active circuit region portion, a plurality of contact pads are disposed right above a bus leading to electrodes of the power transistor by utilizing POE technology, and a plurality of contact pads and lead frames are connected by bonding wire. This minimizes the resistance value and current pathway from the connecting member to the electrode, thereby improving electric characteristics of the power transistor.

FIG. 15 shows a simplified plan view of a part of the semiconductor integrated circuit described in Patent Document 3 and an electrical diagram.

As shown in the plan view of FIG. 15, an active region 2 of the power transistor is formed in an IC chip 1, and on the active region 2 are formed a first bus 3 which is composed of sheet-like metal and is connected with all source electrodes, and a second bus 4 which is connected with all drain electrodes. On the first bus 3 and the second bus 4, three contact pads 5 are respectively provided and connected commonly to each of the bus. The three contact pads 5 on the first bus 3 are disposed so as to be symmetric with the three contact pads 5 on the second bus 4. A bonding wire 6 connecting each of the contact pads 5 and an external lead frame 7 is provided.

The electrical diagram shown in FIG. 15 schematically shows electrical features relating to operation of the power transistor brought about by disposition of a connecting member to the lead frame 7 on the power transistor. Resistance Rs across source and drain of transistor itself, spreading resistance (bus resistance) Rn10, Rn20, Rn30 on the bus and various wire resistances Rb10, Rb20, Rb30 are shown on the electrical diagram.

As shown in FIG. 15, the electric circuit viewed from the lead frame 7 is such a resistance circuit that bus resistances Rn10, Rn20, Rn30 are respectively connected in series to wire resistances Rb10, Rb20, Rb30 of three bonding wires 6 which are connected in parallel to the lead frame 7, and inter-source/drain resistance Rs of the transistor itself is further connected. In this way, by the fact that the bus resistances Rn (10 to 30) are respectively connected in series to the various wire resistances Rb (10 to 30), the bus resistances Rn (10 to 30) and the wire resistances Rb (10 to 30) are eventually connected with each other in parallel, and the whole resistance constituted of the inter-source/drain resistance Rs, the bus resistances Rn (10 to 30) and the wire resistances Rb (10 to 30) is reduced. In other words, since voltage drop relating to the inter-source/drain resistance Rs, the bus resistances Rn (10 to 30) and the wire resistances Rb (10 to 30), and corresponding device effects are lowered, transistor characteristics are improved.

However, as shown in Patent Document 3, for the purpose of minimizing the resistance value and current pathway from the connecting member to the electrode in the power integrated circuit capable of performing wire bonding right above the active circuit region portion, on each one of the buses connected with the source electrode and buses connected with the drain electrode of the power transistor are disposed a plurality of contact pads in distributed fashion so as to be located right above the power transistor.

Therefore, there was such a problem that when a large current is introduced to the power transistor, since buses connected with the electrode of the power transistor are commonly connected with each of a plurality of contact pads, current is concentrated to the power transistor, thereby giving damage thereto depending on types of the power device (e.g., power NPN transistor) and on layout of the bus connected with the electrode, and reliability of the semiconductor integrated circuit is eventually hampered.

SUMMARY OF THE INVENTION

In view of the above circumstances, an object of the present invention is to provide a semiconductor integrated circuit with excellent reliability by identifying a current route leading to a power transistor, optimizing the current flowing through the power transistor to reduce damage or stress exerted to the power transistor, and a method for manufacturing the semiconductor integrated circuit.

In order to accomplish the aforementioned object, a semiconductor integrated circuit according to one aspect of the present invention includes: an interlayer insulation film formed on the power transistor; a plurality of first metal patterns which include a first metal layer formed right above the power transistor, in the interlayer insulation film, and function as a first electrode of the power transistor; a plurality of second metal patterns which include the first metal layer and function as a second electrode of the power transistor; a plurality of first buses which include a second metal layer formed right above the first metal layer, in the interlayer insulation film, and are each electrically connected with, of a plurality of the first metal patterns, a corresponding first metal pattern; and a plurality of second buses which include the second metal layer and are each electrically connected with, of a plurality of the second metal patterns, a corresponding second metal pattern, wherein one contact pad is provided to each of a plurality of the first buses and each of a plurality of the second buses.

In the semiconductor integrated circuit according to one aspect of the present invention, a current pathway of the power transistor is divided by providing one contact pad to each of a plurality of the first buses and each of a plurality of the second buses, and thus a route for current flowing through each of the power transistors can be identified while damage or stress due to current crowding to the power transistor is avoided, and at the same time, optimization of current flowing each of the power transistors is made possible, thereby improving the current permissible level as a whole. As a result, a semiconductor integrated circuit with excellent reliability can be realized.

In the semiconductor integrated circuit according to one aspect of the present invention, each of a plurality of the first buses has preferably the same surface area and each of a plurality of the second buses has preferably the same surface area.

With this configuration, ESD energy is dispersed at the rate of the number of a plurality of the first buses and the second buses, and therefore, a peak value of ESD energy applied to each of the power transistors is lowered by that much. This allows improvement of ESD proof strength of the power transistor, thereby further improving reliability of the semiconductor integrated circuit.

In the semiconductor integrated circuit according to one aspect of the present invention, it is preferable that each of a plurality of the first buses has a different surface area and each of a plurality of the second buses has a different surface area.

With this configuration, the size design of wire length of the bonding wire, the size design of each of the power transistors, and the size design of each of the buses can be realized such that the current density becomes uniform for each of the power transistors, thereby making it possible to equalize load of each of the power transistors itself.

In the semiconductor integrated circuit according to one aspect of the present invention, the power transistor is preferably divided into a plurality of members by a separating layer so as to correspond to each of a plurality of the first buses and each of a plurality of the second buses.

With this configuration, erroneous operations of latch and parasitism hardly occur and reliability of the semiconductor integrated circuit can be further improved.

In the semiconductor integrated circuit according to one aspect of the present invention, size of the power transistor in plan view is larger than the size of each of the contact pads.

With this configuration, a region where, for example, power transistors disposed in lateral direction are formed encompasses, in plan view, contact pads disposed on the power transistor, means for supplying primarily vertical direction current from the contact pad to the power transistor in a distributed manner, and means for connecting a power supply to each of the contact pads. By disposing contact pads which perform power supplying right above the power transistor in this way, area of silicon consumed in the whole circuit design is reduced and thus costs of the IC chip can be reduced. Namely, area of the IC chip can be saved and at the same time, cost reduction of the IC chip is realized.

In the semiconductor integrated circuit according to one aspect of the present invention, each of the contact pads is preferably, in plan view, included in a region where the power transistor is formed.

With this configuration, area of silicon consumed in the whole circuit design is reduced and costs of the IC chip can be reduced in similar fashion as mentioned above. Namely, area of the IC chip can be saved and at the same time, cost reduction of the IC chip is realized.

In the semiconductor integrated circuit according to one aspect of the present invention, it is preferable that each of the contact pads is, in plan view, protruded in part from the region in which the power transistors are formed.

With this configuration, area saving and cost reduction of the IC chip can be realized while a short circuit across outputs due to contact of the bonding wire is prevented.

In the semiconductor integrated circuit according to one aspect of the present invention, it is preferable that each of the contact pads is, in plan view, protruded wholly from the region in which the power transistors are formed.

With this configuration, area saving of the IC chip and cost reduction can be realized while a short circuit across outputs due to contact of the bonding wire is prevented.

In the semiconductor integrated circuit according to one aspect of the present invention, when the power transistor is a DMOS transistor, speeding up and lower power consumption can be realized by reducing ON resistance.

In the semiconductor integrated circuit according to one aspect of the present invention, the power transistor is an insulated gate bipolar transistor.

In the semiconductor integrated circuit according to one aspect of the present invention, when the power transistor is a CMOS transistor, speeding up and lower power consumption can be realized by reducing ON resistance.

In the semiconductor integrated circuit according to one aspect of the present invention, when the power transistor is a bipolar transistor, erroneous operations of latch and parasitism hardly occur and reliability is further improved.

In the semiconductor integrated circuit according to one aspect of the present invention, when the semiconductor substrate is an SOI substrate, there is perfect separation by insulation, and thus erroneous operations of latch and parasitism hardly occur and reliability is further improved.

In the semiconductor integrated circuit according to one aspect of the present invention, when the semiconductor substrate is an epitaxial substrate, current capability of the power transistor is improved.

In the semiconductor integrated circuit according to one aspect of the present invention, thickness of each of the contact pads is preferably more than twice the thickness of each of a plurality of the first buses and a plurality of the second buses.

With this configuration, speeding up and lower power consumption by the reduction in ON resistance of the power transistor are realized and at the same time, crack occurrence can be reduced by absorbing stress at wire bonding.

In the semiconductor integrated circuit according to one aspect of the present invention, it is preferable that connection of the contact pad with the first bus or the second bus is carried out through a single via.

With this configuration, ON resistance of the power transistor can be reduced, and thus speeding up and lower power consumption can be realized.

In the semiconductor integrated circuit according to one aspect of the present invention, diameter of the single via is preferably 50 μm or more.

In the semiconductor integrated circuit according to one aspect of the present invention, it is preferable that connection of the contact pad with the first bus or the second bus is carried out through a plurality of via arrays.

With this configuration, crack occurrence can be reduced by absorbing stress at wire bonding.

In the semiconductor integrated circuit according to one aspect of the present invention, with such a composition that a plurality of the first buses and a plurality of the second buses are formed in increasing order of area from a position closer to an external connection member including at least a lead frame to a position away therefrom, equalization of load applied to each of the power transistors itself can be attained. This is useful for the case where the current permissible value is greater than large current introduced to the power transistor.

In the semiconductor integrated circuit according to one aspect of the present invention, with such a composition that a plurality of the first buses and a plurality of the second buses are formed in descending order of area from a position closer to an external connection member including at least a lead frame to a position away therefrom, area size of the divided buses can be adjusted with the resistance component due to bonding wire length taken into consideration that can be utilized in the size design of the buses. Therefore, the size design of wire length of the bonding wire and each power transistor, and the design of the buses can be realized so that the combined resistance of the resistance component of each of the bonding wires, element resistance of each of the power transistors, and the bus resistance component viewed from the lead frame may become such that the current density may become uniform for each of the power transistors. This realizes equalization of calorific value of each of the power transistor elements per unit area.

In the semiconductor integrated circuit according to one aspect of the present invention, the semiconductor integrated circuit preferably further includes a connecting member mounted to each of the contact pads.

A method for manufacturing a semiconductor integrated circuit according to one aspect of the present invention includes the steps of: forming a power transistor integrated on a semiconductor substrate; forming a first interlayer insulation film on the power transistor; forming a plurality of first metal patterns functioning as a first electrode of the power transistor and a plurality of second metal patterns functioning as a second electrode of the power transistor by depositing a first metal layer right above the power transistor via the first interlayer insulation film and then patterning the first metal layer; forming a second interlayer insulation film on the first interlayer insulation film so as to cover a plurality of the first metal patterns and a plurality of the second metal patterns; forming a plurality of first buses each electrically connected with, of a plurality of the first metal patterns, a corresponding first metal pattern, and a plurality of second buses each electrically connected with, of a plurality of the second metal patterns, a corresponding second metal pattern, by depositing a second metal layer right above the first metal layer via the second interlayer insulation film and then patterning the second metal layer; forming a third interlayer insulation film above the second interlayer insulation film so as to cover a plurality of the first buses and a plurality of the second buses; forming a plurality of openings to the third interlayer insulation film to expose a plurality of the first buses and a plurality of the second buses; and mounting one contact pad to each of a plurality of the first buses and a plurality of the second buses exposed to each of a plurality of the openings.

According to the method for manufacturing a semiconductor integrated circuit according to one aspect of the present invention, a semiconductor integrated circuit according to one aspect which provides the aforementioned advantageous effects can be realized.

In the method for manufacturing the semiconductor integrated circuit according to one aspect of the present invention, each of a plurality of the first buses and each of a plurality of the second buses are formed in increasing order of area from a position closer to the external connection member including at least the lead frame to a position away therefrom.

In the method for manufacturing the semiconductor integrated circuit according to one aspect of the present invention, each of a plurality of the first buses and each of a plurality of the second buses are formed in decreasing order from a position closer to the external connection member including at least lead frame to a position away therefrom.

In the method for manufacturing the semiconductor integrated circuit according to one aspect of the present invention, each of a plurality of the first buses has the same surface area and each of a plurality of the second buses has the same surface area.

As has been described hereinbefore, in the semiconductor integrated circuit according to one aspect of the present invention and a method for manufacturing the semiconductor integrated circuit, a current pathway of the power transistor is divided by providing one contact pad to each of a plurality of the first buses and each of a plurality of the second buses, and thus a route for current flowing through each of the power transistors can be identified while damage or stress due to current crowding to the power transistor is avoided, and at the same time, optimization of the current flowing through each of the power transistors is made possible, thereby improving the current permissible level of the power transistor as a whole. As a result, a semiconductor integrated circuit with excellent reliability can be realized.

As advantageous effects provided by the semiconductor integrated circuit according to one aspect of the present invention and a method for manufacturing the semiconductor integrated circuit, general versatility of specifications and applications is enhanced, if the means for connecting a power supply includes mutual connection of wire bonding and solder balls.

Further, as advantageous effects provided by the semiconductor integrated circuit according to one aspect of the present invention and a method for manufacturing the semiconductor integrated circuit, by providing sufficient thickness to absorb mechanical, thermal, and impact stresses to the insulation layer separating the contact pad and circuit and to the pad metal layer, semiconductor probing and wire bonding are carried out, and reliability of process and operation of soldered assemblies can be improved.

Further, as advantageous effects provided by the semiconductor integrated circuit according to one aspect of the present invention and a method for manufacturing the semiconductor integrated circuit, elimination of process-related restrictions on probing, wire bonding, and solder connection becomes possible, and this minimizes the risk of cracking damage to the very brittle circuit dielectric body.

Further, as advantageous effects provided by the semiconductor integrated circuit according to one aspect of the present invention and a method for manufacturing the semiconductor integrated circuit, it is possible to present a versatile and flexible design and layout concept, and method of process that are applicable to many of semiconductor IC product groups and to products over several generations.

Further, as advantageous effects provided by the semiconductor integrated circuit according to one aspect of the present invention and a method for manufacturing the semiconductor integrated circuit, it is possible to present low-cost and high-speed processes for manufacturing, tests, and assemblies.

Further, as advantageous effects provided by the semiconductor integrated circuit according to one aspect of the present invention and a method for manufacturing the semiconductor integrated circuit, it is possible to use only designs and processes which are commonly used and accepted in the manufacturing of semiconductor IC products, and this feature saves additional capital investments and allows utilization of existing infrastructure of the manufacturing apparatuses.

Further, as preferable embodiments of the semiconductor integrated circuit according to one aspect of the present invention and a method for manufacturing the semiconductor integrated circuit, the following are exemplified. (1) An example where the power transistor is disposed as a cell of array composition. For example, a long stripe profile designed to be lateral direction layout is considered. (2) For vertical style, vertical and horizontal type trench devices including SOI (Silicon On Insulator) technology are exemplified. (3) For a voltage less than 10 V, a preferred example is a horizontal type transistor based on CMOS technology. For a voltage 10 V or more, a drain expansion type device is preferable. (4) For a voltage over approximately 20 V, an LDMOS technology based device is a preferable example. Similarly, a device based on IGBT (Insulated Gate Bipolar Transistor) technology is a preferable example. (5) A bipolar transistor which can be produced with inexpensive process costs is a preferable example.

BRIEF DESCRIPTION OF THE DRAWINGS

FIG. 1 is a simplified plan view showing schematically a part of an IC chip, which is an important part of the semiconductor integrated circuit according to a first embodiment of the present invention and has a composition where one contact pad is disposed on each of six bus metal layers (third layer bus) while area thereof is made gradually different from each other, and an electrical diagram showing electric resistance along with flow of the current is shown under the plan view.

FIG. 3 is a simplified plan view showing schematically a part of an IC chip, which is an important part of the semiconductor integrated circuit according to the first embodiment of the present invention and has a composition where each one contact pad is disposed on each of six bus metal layers (third layer bus) while area thereof is made gradually different from each other, and an electrical diagram showing electric resistance along with flow of the current is shown under the plan view.

FIG. 12(a) is a simplified sectional view showing an important part of an integrated DMOS transistor which is the semiconductor integrated circuit according to a fifth modified example of the first example in the second embodiment of the present invention having such a structure that solder balls are provided as the connection member, and 12(b) is a simplified sectional view showing schematically an important part of an integrated DMOS transistor which is the semiconductor integrated circuit according to a sixth modified example of the first example in the second embodiment of the present invention having such a structure that a plated metal layer is provided as the connection member.

FIG. 15 is a simplified plan view showing schematically an important part of an IC chip including the power transistor having such a structure that a plurality of contact pads are disposed on each of the bus metal layers and are commonly connected on the bus metal layer, used in the prior art.

DESCRIPTION OF THE PREFERRED EMBODIMENTS

First Embodiment

Figure 2:
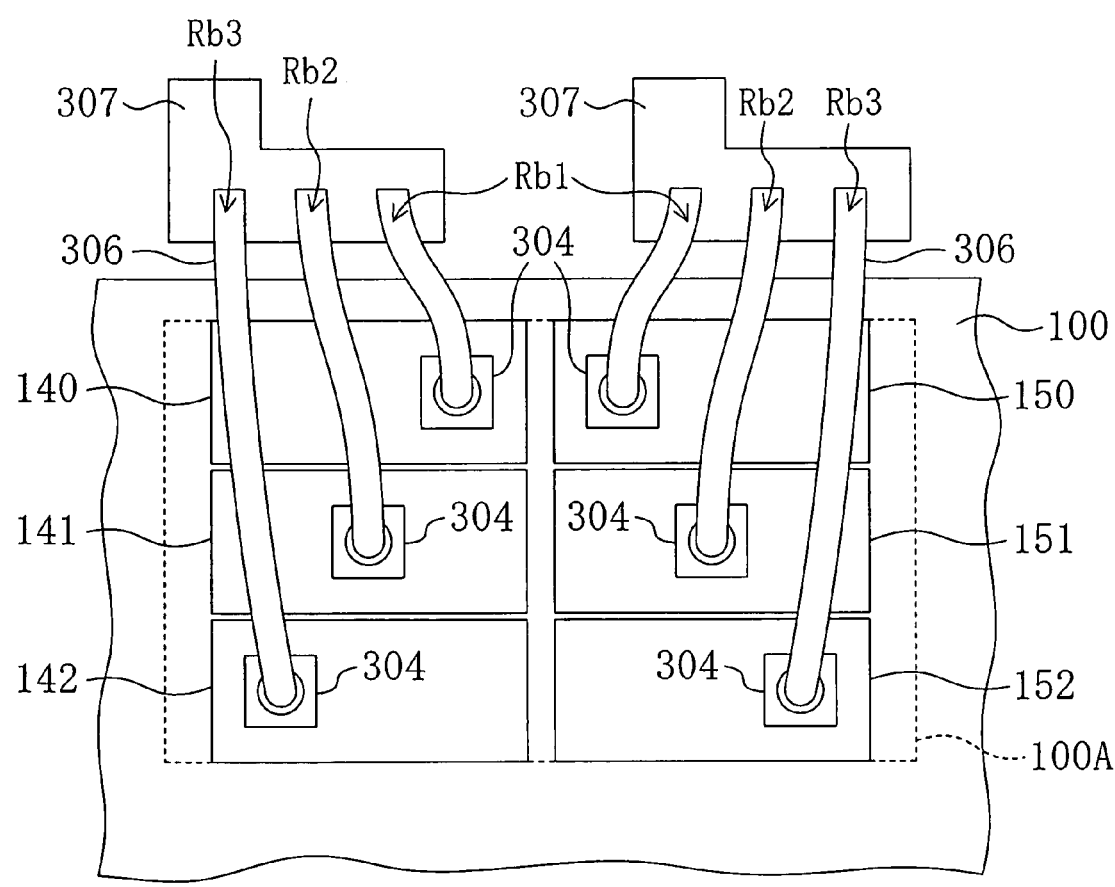
FIG. 2 is a simplified plan view showing schematically a part of an IC chip, which is an important part of the semiconductor integrated circuit according to the first embodiment of the present invention and has a composition where one contact pad is disposed on each of six bus metal layers divided evenly.

A semiconductor integrated circuit according to a first embodiment of the present invention and a method for manufacturing the semiconductor integrated circuit will be explained hereafter referring to drawings.

—Composition of FIG. 1—

FIG. 1 is a simplified plan view showing a part of the semiconductor integrated circuit according to the first embodiment of the present invention, along with an electrical diagram.

As shown in the plan view of FIG. 1, an active region 100A of a power transistor is formed in an IC chip 100. On the active region 100A are formed comparatively broader buses 140 to 142, 150 to 152 so as to cover source and drain regions of the power transistor. This configuration allows improvement of integration degree of ICs and enables saving of chip formation. The three buses 140 to 142 are uppermost metal layers (third metal layers) composed of sheet-like metal, and each bus is connected with the source electrode and separated from other by an insulation layer. Further, the three buses 150 to 152 are uppermost metal layer (third metal layer) composed of sheet-like metal, positioned so as to be horizontally symmetric with the three buses 140, 141, 142, and each bus is connected with the drain electrode and separated from other by an insulation layer. One contact pad 304 is formed on each of the buses 140 to 142, 150 to 152, and a bonding wire 306 is provided for connection of each of the contact pads 304 and an external lead frame 307 (power supply).

Further, as shown in the plan view of FIG. 1, area of each of the buses 140 to 142, 150 to 152 is different from each other; the buses 140 to 142 are formed in increasing order of area from a position closer to the lead frame 307 to a position away therefrom, and similarly, the buses 150 to 152 are formed in increasing order of area from a position closer to the lead frame 307 to a position away therefrom.

Meanwhile, the semiconductor integrated circuit shown in FIG. 1 is an active circuit. Here, the active circuit denotes various electric parts which provide functionality to ICs. In particular, in the present specification, the active circuit denotes a metal layer which serves as a power bus of power transistors disposed in a lateral direction.

Here, the semiconductor integrated circuit according to the present embodiment having the structure shown in FIG. 1 has electrical features shown in the electrical diagram shown at a lower part of FIG. 1.

In other words, the electrical diagram shown at the lower part of FIG. 1 schematically shows electrical features according to operation of the power transistor which are brought by disposing connecting members to the lead frame 307 on the power transistor. In the electrical diagram, source-drain resistances of three transistors themselves are represented by Rs1, Rs2, and Rs3. Spreading resistance on the six buses 140 to 142, 150 to 152 is resistance against the current flowing through each bus, and the three buses 140 to 142 are horizontally symmetric with the three buses 150 to 152, and thus three horizontally symmetric bus resistances are represented by Rn1, Rn2, and Rn3, and similarly, various wire resistances which are horizontally symmetric are represented by Rb1, Rb2, and Rb3.

As shown in FIG. 1, in the electrical diagram viewed from the lead frame 307, bus resistances Rn1, Rn2, and Rn3 are respectively connected in series to wire resistances Rb1, Rb2, and Rb3 of three bonding wires which are connected in parallel with the lead frame 307, and source-drain resistances Rs1, Rs2, and Rs3 of transistor themselves are further connected to form three horizontally symmetrical parallel resistance circuits.

As it is apparent from comparison between the electrical diagram shown in FIG. 1 and the electrical diagram shown in FIG. 15 which is explained as the prior art, in the prior art, a plurality of contact pads are connected commonly to the bus of the uppermost metal layer and hence one current pathway is used for the power transistors, while in the present embodiment, the six buses 140 to 142, 150 to 152 are provided so as to correspond to respective six contact pads 304 so that one bus is provided to one contact pad, the power transistors are divided into three, and the current pathway of the power transistors is also divided into three. Accordingly, the route for current flowing through each of the power transistors can be identified while damage or stress due to current crowding to the power transistor is avoided, and at the same time, optimization of the current flowing through each of the power transistors is made possible. Therefore, the current permissible level of the power transistor can be increased as a whole, and even in the case where large current is introduced to the power transistor, damage to the power transistor due to unforeseen current crowding and occurrence of warpage due to unforeseen stress could be prevented, and it is eventually possible to realize a semiconductor integrated circuit with excellent reliability.

Further, as opposed to the conventional example in which a plurality of contact pads are connected commonly to one bus, by such a composition that one contact pad 304 is connected with one of the divided buses, area size of each of the divided buses can be adjusted with the resistance component due to bonding wire length being taken into consideration that can be utilized for the size design of the buses. For example, as shown in plan view of FIG. 1, by designing each bus to have an area size corresponding to the magnitude of the resistance component of the bonding wire 306, wire length of the bonding wire 306, size design of each of power transistors, and design of bus can be realized so that a combined resistance of resistance component of each of bonding wires 306, element resistance of each of power transistors, and bus resistance component viewed from the lead frame 307 may become uniform for every current path, equalization of loads applied to each of power transistor elements itself can be attained, thereby realizing a semiconductor integrated circuit with excellent reliability.

For example, when resistance value per unit length of the bonding wire is supposed to be 50 mΩ/mm, and if wire length of each of the bonding wires 306 is designed to be 1 mm, 1.5 mm, and 2 mm, three wire resistances due to wire length of each of the bonding wires 306 are designed to be Rb1=0.05Ω, Rb2=0.075Ω, and Rb3=0.1Ω, three bus resistances (spreading resistance) are designed to be Rn1=0.11Ω, Rn2=0.1Ω, and Rn3=0.09Ω, and source-drain resistances of the transistor are designed to be Rs1=0.16Ω, Rs2=0.13Ω, and Rs3=0.1Ω, then each of series resistance values of resistance component of each of bonding wires 306, element resistance component, and bus resistance component of each of power transistors are expressed as follows:

$$Rb1 \times 2 + Rn1 \times 2 + Rs1 = Rb2 \times 2 + Rn2 \times 2 + Rs2$$
$$= Rb3 \times 2 + Rn3 \times 2 + Rs3$$
$$= 0.48\Omega$$

Therefore, resistance of the power transistor between two terminals of the lead frame 307 is 0.16 (0.48Ω/3=0.16Ω).

Further, although in FIG. 1, as bus layout, explanation is given for a case where three buses are disposed horizontally symmetrically to provide six buses, similar advantageous effects are obtainable for a case where bus arrangement is not horizontally symmetric, namely, arrangement of the buses for dividing the current pathway is divided schematically horizontally, schematically laterally, or schematically diagonally to avoid symmetry.

For example, it is supposed that wire resistance Rb1 due to wire length of each of the bonding wires 306 is represented by Rb1A and Rb1B; wire resistance Rb2 is represented by Rb2A and Rb2B; wire resistance Rb3 is represented by Rb3A and Rb3B; bus resistance (spreading resistance) Rn1 is represented by Rn1A and Rn1B; bus resistance Rn2 is represented by Rn2A and Rn2B; bus resistance Rn3 is represented by Rn3A and Rn3B; and source-drain resistances of the transistor itself is represented by Rs1, Rs2, and Rs3, and parameters of each of resistance numerical values are designed appropriately. In this case, resistance of the power transistor between two terminals of the lead frame 307 including each of series resistance values of resistance component of each of the bonding wires 306, element resistance component, bus resistance component of each of power transistors is expressed by the following equations:

Resistance of power transistor between two terminals of lead frame=$((Rb1A+Rn1A+Rs1+Rb1B+Rn1B) \times (Rb2A+Rn2A+Rs2+Rb2B+Rn2B) \times (Rb3A+Rn3A+Rs3+Rb3B+Rn3B)) / \{(Rb1A+Rn1A+Rs1+Rb1B+Rn1B) \times (Rb2A+Rn2A+Rs2+Rb2B+Rn2B)+(Rb2A+Rn2A+Rs2+Rb2B+Rn2B) \times (Rb3A+Rn3A+Rs3+Rb3B+Rn3B)+(Rb3A+Rn3A+Rs3+Rb3B+Rn3B) \times (Rb1A+Rn1A+Rs1+Rb1B+Rn1B)\}$ Further, as opposed to the conventional example in which a plurality of contact pads are connected commonly to one bus, by such a composition that one contact pad 304 is connected with each of the divided buses, area size of each of the divided buses can be adjusted with the resistance component due to bonding wire length being taken into consideration that can be utilized for the size design of the buses. This optimizes, for every current path, the combined resistance value of resistance component of each of the bonding wires 306, element resistance of each of the power transistors, and bus resistance component viewed from the lead frame 307 to realize the design of wire length of the bonding wire 306, the size design of each of the power transistors, and bus design, thereby realizing a semiconductor integrated circuit with excellent reliability.

In this way, by such a composition that one contact pad 304 is provided for each of the divided buses, area size of the divided buses can be adjusted with the resistance component due to bonding wire length being taken into consideration that can be utilized for the size design of the buses. Therefore, as mentioned above, the design of wire length of the bonding wire 306, the size design of each of the power transistors, and bus design can be realized so that the resistance component may become uniform for every current path. This allows for equalization of loads applied to each of power transistor elements themselves, thereby realizing a semiconductor integrated circuit with excellent reliability.

—Composition of FIG. 2—

Further, as profiles of each of the buses 140 to 142, 150 to 152 which are metal layers at the uppermost layer in the semiconductor integrated circuit shown in FIG. 1, as shown in the plan view in FIG. 2, it is also possible to provide such a composition that area of each of the buses 140 to 142, 150 to 152 may become uniform. Other compositions are same as the semiconductor integrated circuit shown in FIG. 1.

According to the semiconductor integrated circuit shown in FIG. 2, as opposed to the conventional example in which a plurality of contact pads are connected commonly to one bus, in addition to that effects by the aforementioned semiconductor integrated circuit shown in FIG. 1 are obtained by dividing each bus and by providing one contact pad 304 to each of the divided buses, the following effects are further obtainable by that area of each of the buses 140 to 142, 150 to 152 which are third metal layers at the uppermost layer is uniform.

In other words, due to that the six buses 140 to 142, 150 to 152 separated from each other are formed so as to have nearly even area and that one contact pad 304 is provided to each of the buses 140 to 142, 150 to 152, ESD energy is distributed from the lead frame 307 to which ESD energy is applied directly, via the bonding wire 306, by as much as the six buss 140 to 142, 150 to 152 separated from each other, and therefore, a peak value of ESD energy applied to each of power transistor elements is reduced by as much as mentioned distribution. Accordingly, ESD proof strength of the power transistor can be improved, thereby realizing a semiconductor integrated circuit with better reliability.

For example, when three bus resistances (spreading resistance) are designed to be $Rn1=0.1\Omega$, $Rn2=0.1\Omega$, $Rn3=0.1\Omega$, and source-drain resistance of the transistor itself is designed to be $Rs1=0.13\Omega$, $Rs2=0.13\Omega$, $Rs3=0.13\Omega$, each of series resistance value of element resistance component and bus resistance component of each of power transistors is expressed by the equation shown below:

$$Rn1 \times 2 + Rs1 = Rn2 \times 2 + Rs2$$
$$= Rn3 \times 2 + Rs3$$
$$= 0.33\Omega$$

In this way, when ESD energy is applied from the lead frame 307 via the bonding wire 306, a peak value of ESD energy applied to each of power transistor elements having evenly divided resistance component acts in that ESD energy is distributed depending on the number of mutually divided buses, and hence, ESD proof strength of the power transistor, which is determined by peak value of ESD energy, can be improved. Further, it is possible to reduce stress due to metal layer stress of a large size bus by evenly dividing the large size bus of the power transistor. Therefore, no large area metal layer is present in the power transistor and warpage occurrence is reduced. In this way, it is possible to realize a semiconductor integrated circuit with better reliability.

—Composition of FIG. 3—

For profiles of each of the buses 140 to 142, 150 to 152 which are metal layers at the uppermost layer in the semiconductor integrated circuit shown in FIG. 1, as shown in the plan view of FIG. 3, it is also possible to provide such a composition that area of each of the buses 140 to 142, 150 to 152 is different from each other; for the buses 140 to 142, each area becomes gradually smaller from a position closer to the lead frame 307 to a position away therefrom; similarly, for the buses 150 to 152, each area becomes gradually smaller from a position closer to the lead frame 307 to a position away therefrom. Meanwhile, other compositions are same as the semiconductor integrated circuit shown in FIG. 1.

Similarly, for composition in FIG. 3, as it is apparent from comparison between FIG. 3 and the electrical diagram shown in FIG. 15 which is explained in the prior art, with conventional example, a plurality of contact pads are connected commonly to metal layer bus of the uppermost layer and hence one current pathway is used for the power transistors themselves, while in the present embodiment, each of a plurality of buses has surface area different from each other. Namely, herein, the buses 140 to 142, 150 to 152 are formed in decreasing order of area from a position closer to the lead frame 307 to a position away therefrom. Accordingly, area size of the divided buses can be adjusted with the resistance component due to bonding wire length being taken into consideration that can be utilized for the size design of the buses. A first electrode side of the power transistor itself is divided and current pathway of the power transistor itself is also divided, and current route flowing through each power transistor itself can be identified and at the same time, optimization of current density flowing through each power transistor element itself is attained.

Further, the semiconductor integrated circuit shown in FIG. 3 can be utilized when the allowable current value of each of bonding wires 307 is greater than large current introduced to actual power transistor, the design of wire length of the bonding wire, the size design of each of the power transistors, and bus design can be realized so that combined resistance value of resistance component of each of the bonding wires, element resistance of each of power transistors, and bus resistance component viewed from the lead frame may be such that the current density may be uniform for every power transistor, thereby realizing equalization of loads applied to each of the power transistor elements themselves.

Further, when a large bus area is divided into appropriate sizes, and one contact pad 304, which forms current pathway for every path of a first bus group (e.g., buses 140 to 142) and a second bus group (e.g., buses 150 to 152) including a plurality of buses (e.g., buses 140 to 142, 150 to 152) to which a first and a second electrodes are connected, is disposed, the current pathway is divided, damage to the power transistor due to unforeseen current crowding is prevented, equalization of calorific value per unit area of the power transistor element itself is attained, and destruction of power transistor element due to local heat generation can be prevented.

For example, when resistance value per unit length of wire bonding is supposed to be 50 m$\Omega$/mm, wire length of each of the bonding wires 306 is designed to be 1 mm, 1.5 mm, 2 mm; three wire resistances depending on wire length of each of the bonding wires 306 are designed to be $Rb1=0.05\Omega$, $Rb2=0.75\Omega$, $Rb3=0.1\Omega$; three bus resistances (spreading resistance) are designed to be $Rn1=0.09\Omega$, $Rn2=0.1\Omega$, $Rn3=0.11\Omega$; source-drain resistances of the transistor itself are designed to be $Rs1=0.1\Omega$, $Rs2=0.13\Omega$, $Rs3=0.16\Omega$, each series resistance value of resistance component of each of the bonding wires 306, element resistance of each of the power transistors, and bus resistance component is expressed by the equation shown below:

$$Rb1 \times 2 + Rn1 \times 2 + Rs1 = 0.38\Omega$$

$$Rb2 \times 2 + Rn2 \times 2 + Rs2 = 0.48\Omega$$

$$Rb3 \times 2 + Rn3 \times 2 + Rs3 = 0.58\Omega$$

Then, if currents flowing through each of the power transistor elements are represented by I1, I2, I3, the following equation is established for voltage loss due to each series resistance values of resistance components of each of the bonding wires 306, element resistance of each of power transistors, bus resistance component:

$$(Rb1 \times 2 + Rn1 \times 2 + Rs1) \times I1$$

$$(Rb2 \times 2 + Rn2 \times 2 + Rs2) \times I2$$

$$(Rb3 \times 2 + Rn3 \times 2 + Rs3) \times I3$$

Ratio of currents I1, I2, I3 flowing through each of power transistor elements is nearly proportional to area ratio (size ratio) of each of power transistors and is expressed by the following relational expression:

I1:I2:I3=1.526:1.208:1

Resistance of the power transistor across two terminals of the lead frame 307 becomes 0.155Ω.

Thus, since each bus is divided for every one contact pad 304, it is possible to adjust area size of the divided buses with the resistance component due to bonding wire length being taken into considerations that can be utilized in the size design of the buses. Therefore, through adjustments so that current could be introduced according to size of each of the power transistors in the current pathway for every power transistor, current density flowing through each of the divided power transistors themselves becomes nearly uniform and at the same time, currents flowing through each of the power transistors do not cause current crowding even at large current state, and currents flow according to size of each of the power transistor elements themselves. Accordingly, loads applied to power transistor elements itself, bonding wire, metal layer bus, via are uniformly distributed, equalization of calorific value per unit area of the power transistor element itself is attained, destruction of power transistor elements due to local heat generation is prevented, and allowable current value of the power transistor element itself is improved as a whole. As a result, reliability of the semiconductor integrated circuit is improved.

Further, in FIG. 3, although explanation is given for the case where three buses are disposed horizontally symmetrically to provide six buses, same effects are obtainable for a case where bus arrangement is not horizontally symmetric, namely, bus arrangement for dividing current pathway is divided nearly right and left, nearly upper and lower, or nearly diagonally, and symmetry is not attained.

For example, suppose that wire resistance Rb1 due to wire length of each of the bonding wires 306 is represented by Rb1A, Rb1B; wire resistance Rb2 is represented by Rb2A, Rb2B; wire resistance RB3 is represented by Rb3A, Rb3B; bus resistance (spreading resistance) Rn1 is represented by Rn1A, Rn1B; bus resistance Rn2 is represented by Rn2A, Rn2B; bus resistance Rn3 is represented by Rn3A, Rn3B; and source-drain resistances of the transistor itself is represented by Rs1, Rs2, Rs3, and parameters of each of the resistance numerical values are designed appropriately. In this case, resistance of the power transistor across two terminals of the lead frame 307 including each of the series resistance values of resistance component of each of the bonding wires 306, element resistance component of each of power transistors, bus resistance component is expressed by the following equations:

Resistance of power transistor across two terminals of
lead frame=$((Rb1A+Rn1A+Rs1+Rb1B+Rn1B) \times$
$(Rb2A+Rn2A+Rs2+Rb2B+Rn2B) \times (Rb3A+Rn3A+$
$Rs3+Rb3B+Rn3B))/\{(Rb1A+Rn1A+Rs1+Rb1B+$
$Rn1B) \times (Rb2A+Rn2A+Rs2+Rb2B+Rn2B)+$
$(Rb2A+Rn2A+Rs2+Rb2B+Rn2B) \times (Rb3A+Rn3A+$
$Rs3+Rb3B+Rn3B)+(Rb3A+Rn3A+Rs3+Rb3B+$
$Rn3B) \times (Rb1A+Rn1A+Rs1+Rb1B+Rn1B)\}$ In this way, by such a composition that one contact pad 304 is provided for each of the divided buses, area size of the divided buses can be adjusted with the resistance component due to bonding wire length being taken into consideration that can be utilized for the size design of the buses. Accordingly, through adjustments so that current could be introduced according to size of each of the power transistors in the current pathway for every power transistor, current density flowing through each of the divided power transistors itself becomes nearly uniform and at the same time, currents flowing through each of the power transistors do not cause current crowding even at large current state, and currents flow according to size of each of the power transistor elements itself. Accordingly, loads applied to power transistor elements themselves, bonding wire, metal layer bus, via are uniformly distributed, equalization of calorific value per unit area of the power transistor element itself is attained, destruction of power transistor elements due to local heat generation is prevented, and allowable current value of the power transistor element itself is improved as a whole. As a result, reliability of the semiconductor integrated circuit is improved.

—Composition common to FIG. 1 through FIG. 3—

Here, positional relationship between the buses 140 to 142, 150 to 152 which are metal layers at the uppermost layer in the semiconductor integrated circuit shown in FIG. 1 through FIG. 3, and two metal layers provided whereunder will be explained. Although explanation will be given hereafter referring to the semiconductor integrated circuit shown in FIG. 2, among FIG. 1 through FIG. 3, the semiconductor integrated circuit shown in FIG. 1 can be easily understood from the following explanation.

Figure 4:
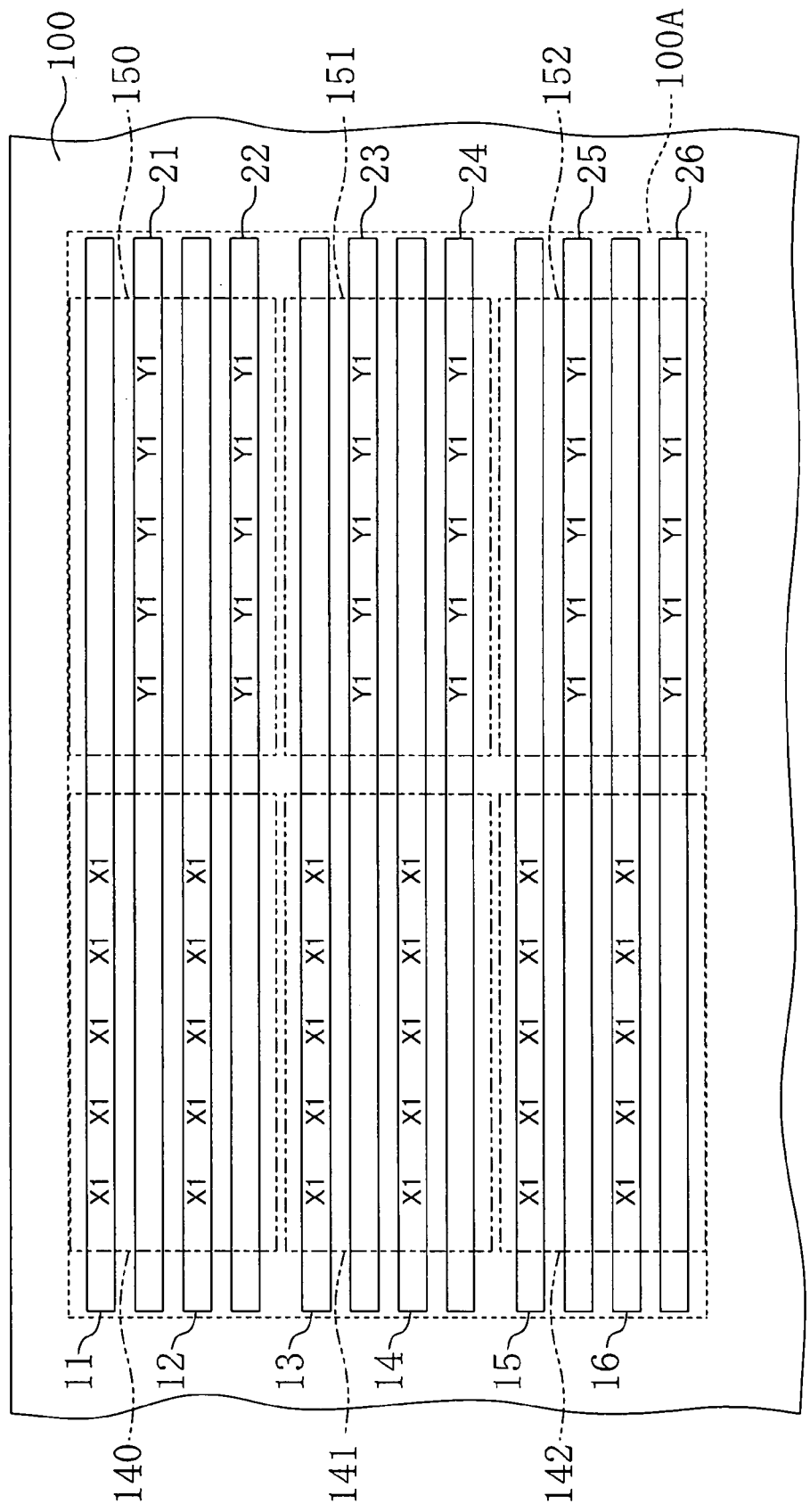
FIG. 4 is a simplified plan view showing schematically a part of IC chip, which is an important part of the semiconductor integrated circuit according to the first embodiment of the present invention, and shows arrangement relationship between six bus metal tubes divided evenly (third layer bus), a metal layer (second layer bus) serving as a line for source electrode and drain electrode at one lower layer thereof, and a via.
Figure 5:
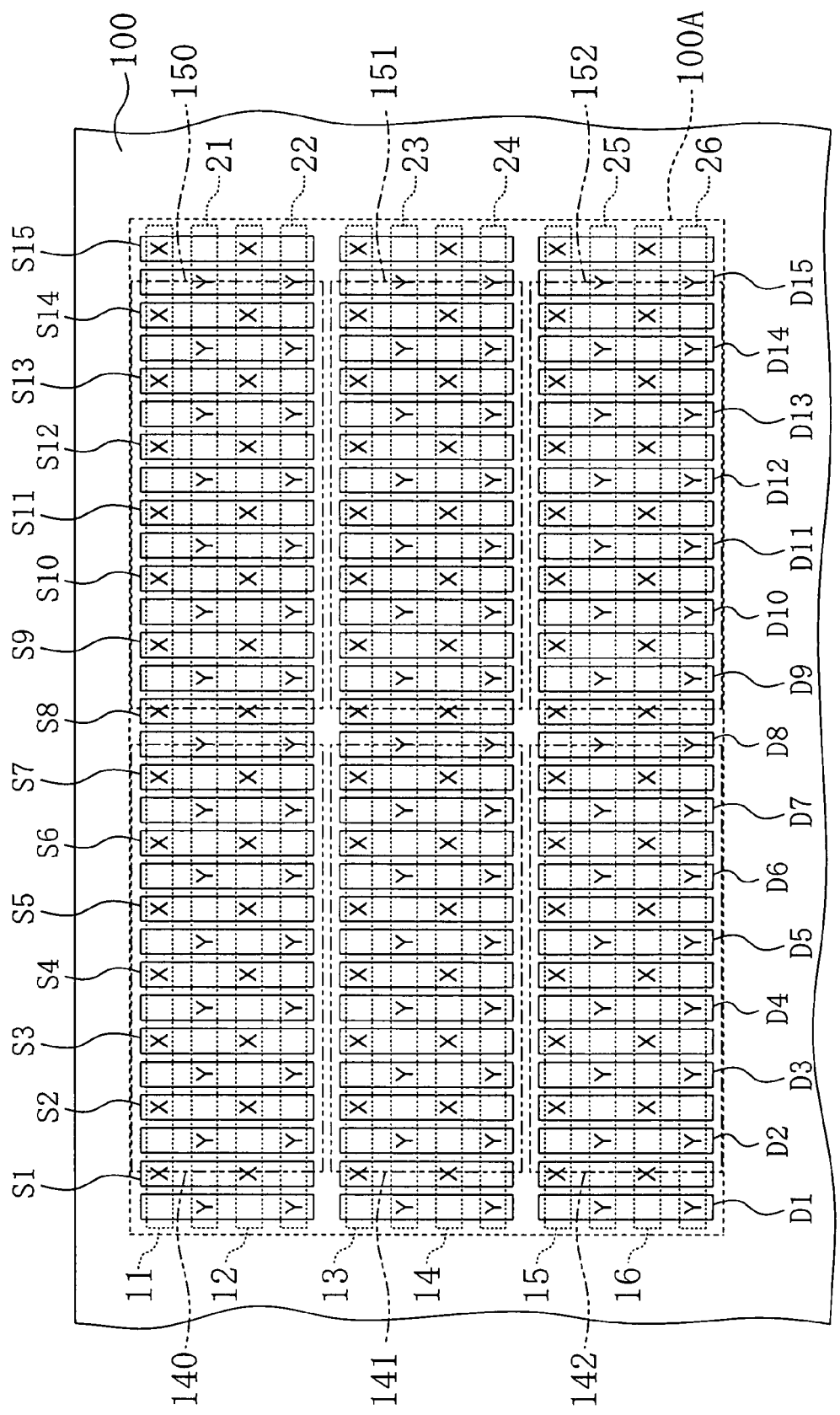
FIG. 5 is a simplified plan view showing schematically a part of an IC chip, which is an important part of the semiconductor integrated circuit according to the first embodiment of the present invention, and shows arrangement relationship between six bus metal layers divided evenly (third layer bus), a metal layer (second layer bus) serving as a line for source electrode and drain electrode at one lower layer thereof, a metal layer (first layer bus) serving as source electrode and drain electrode at further one lower layer thereof, and a via.

FIG. 4 and FIG. 5 are plan views showing schematically positional relationship with regard to metal layer at a lower side of the buses 140 to 142, 150 to 152 shown in FIG. 2. In FIG. 4 and FIG. 5, each of the buses 140 to 142, 150 to 152 is shown transparently, and in FIG. 5, the second layer bus is shown transparently.

First, as shown in FIG. 4, at a lower side of the buses 140 to 142, 150 to 152 which act as the third layer in the present invention, metal layers 11, 12, 13, 14, 15, 16 of a source line (first metal pattern) as the second layer bus (second metal layer) and metal layers 21, 22, 23, 24, 25, 26 of a drain line (second metal pattern) as the second layer bus are formed alternately so that they have elongated lateral direction stripe profile and are parallel with a constant pitch. The third layer buses 140, 141, 142 are connected with source lines 11 and 12, 13 and 14, 15 and 16, respectively which serve as the second layer bus through a plurality of vias X1 to which metal is filled; the third layer buses 150, 151, 152 are connected with drain lines 21 and 22, 23 and 24, 25 and 26, respectively through a plurality of vias Y1 to which metal is filled.

Further, as shown in FIG. 5, at lower side of metal layers 11 to 16, 21 to 26 of the source line and the drain line as the second layer bus, metal layers S1 to S15 of a source electrode line (first metal pattern) as the first layer bus (first metal layer) and metal layers D1 to D15 of a drain electrode line (second metal pattern) as the first layer bus are formed alternately so that they run directly with these second layer buses, have elongated vertical direction stripe profile and are parallel with a constant pitch. Metal layers S1 to S15 of the source electrode line of the first layer bus are electrically connected with source lines 11 to 16, each of which is second layer bus, respectively, through a plurality of vias X to which metal is filled, metal layers D1 to D15 of the drain electrode line of the first layer bus are electrically connected with drain lines 21 to 26, which is second layer bus, respectively, through a plurality of vias Y to which metal is filled. Meanwhile, FIG. 1 through FIG. 5 are primarily for explanation of positional relationships between first layer bus through third layer bus, via, contact pad, and bonding wires formed on a semiconductor substrate, and interlayer insulation film (e.g., first through fourth interlevel insulator layer in the second embodiment) (not shown) formed between each of the buses, openings and other concrete compositions will be explained in the second embodiment using concrete examples.

First Modified Example

Figure 6:
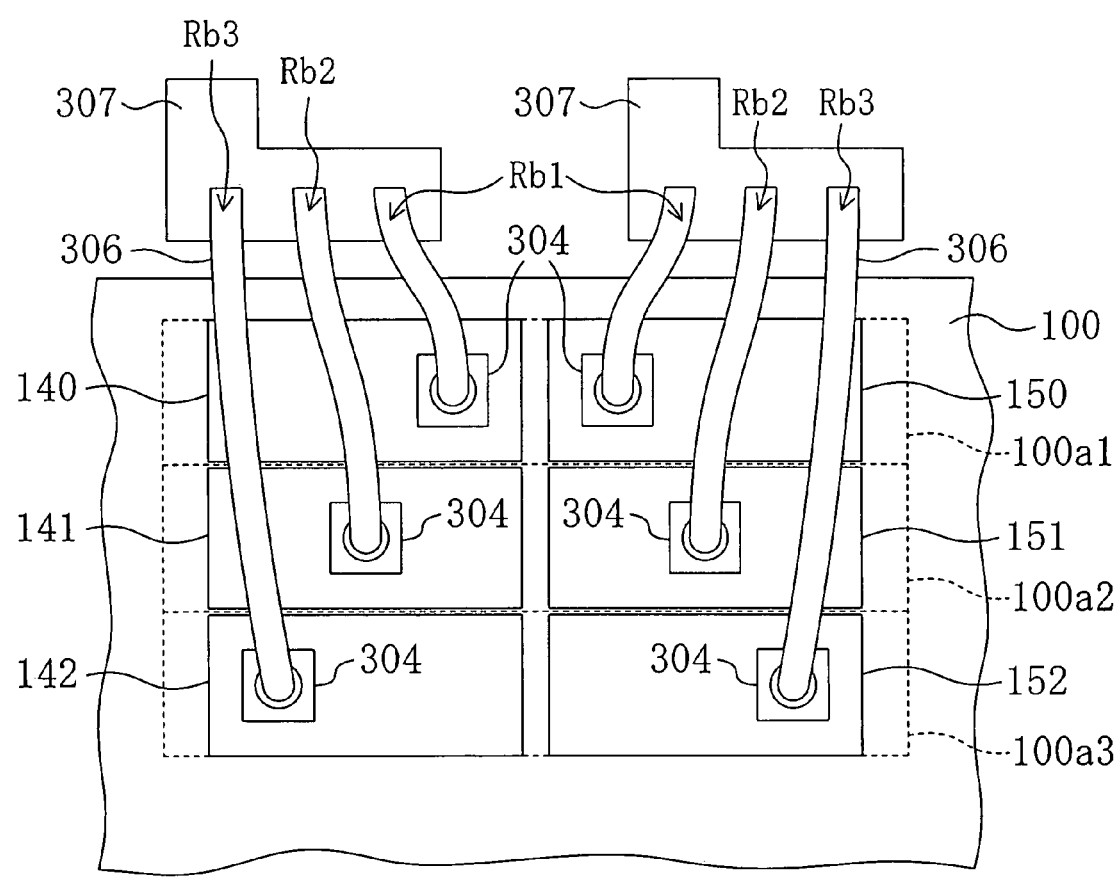
FIG. 6 is a simplified plan view showing schematically a part of an IC chip, which is an important part of the semiconductor integrated circuit according to a first modified example of the first embodiment of the present invention having such a structure that one contact pad is disposed on each of six bus metal layers divided evenly, and divided three power transistors are enclosed individually by a separation region.

FIG. 6 is a simplified plan view showing the first modified example in the semiconductor integrated circuit according to the first embodiment of the present invention. The first modified example is an example applicable to both of the semiconductor integrated circuits shown in FIG. 1 through FIG. 3, and the following description explains a case where it is applied to the semiconductor integrated circuit shown in FIG. 2 as the first modified example.

In a first modified example shown in FIG. 6, an active region of a power transistor is divided into three active regions 100a1, 100a2, 100a3, and this is different from the semiconductor integrated circuit shown in FIG. 2 in that three power transistors electrically separated from each other by separation region are formed in three active regions 100a1, 100a2, 100a3. Other compositions are identical with the semiconductor integrated circuits shown in FIG. 1 through FIG. 3.

With these features, the horizontally symmetric buses 140 and 150, 141 and 151, and 142 and 153 are connected with the source electrode and drain electrode of one power transistor electrically separated from adjoining transistor via a contact pad 304, and therefore, erroneous operations such as latch and parasitism hardly occur and reliability is further improved.

Meanwhile, although FIG. 6 shows a case where area of each of the buses 140, 141, 142, 150, 151, 152 is equal to each other, same effects are obtainable even a case where area is different each other as shown in, for example, FIG. 4 mentioned above.

Second Modified Example

Figure 7:
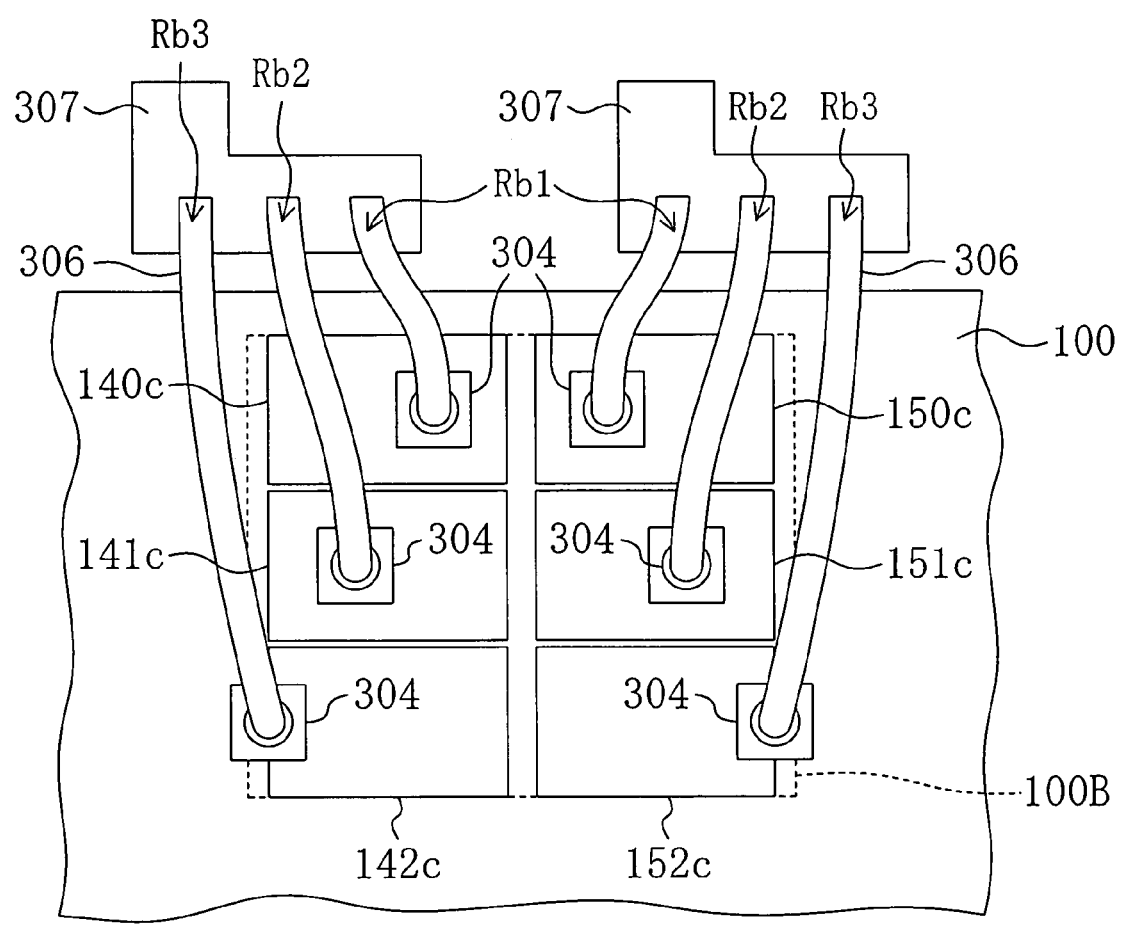
FIG. 7 is a simplified plan view showing schematically a part of an IC chip, which is an important part of the semiconductor integrated circuit according to a second modified example of the first embodiment of the present invention having such a structure that one contact pad is disposed on each of six bus metal layers divided evenly, and a pad right above the device is protruded in part from a bus right below the pad.
Figure 8:
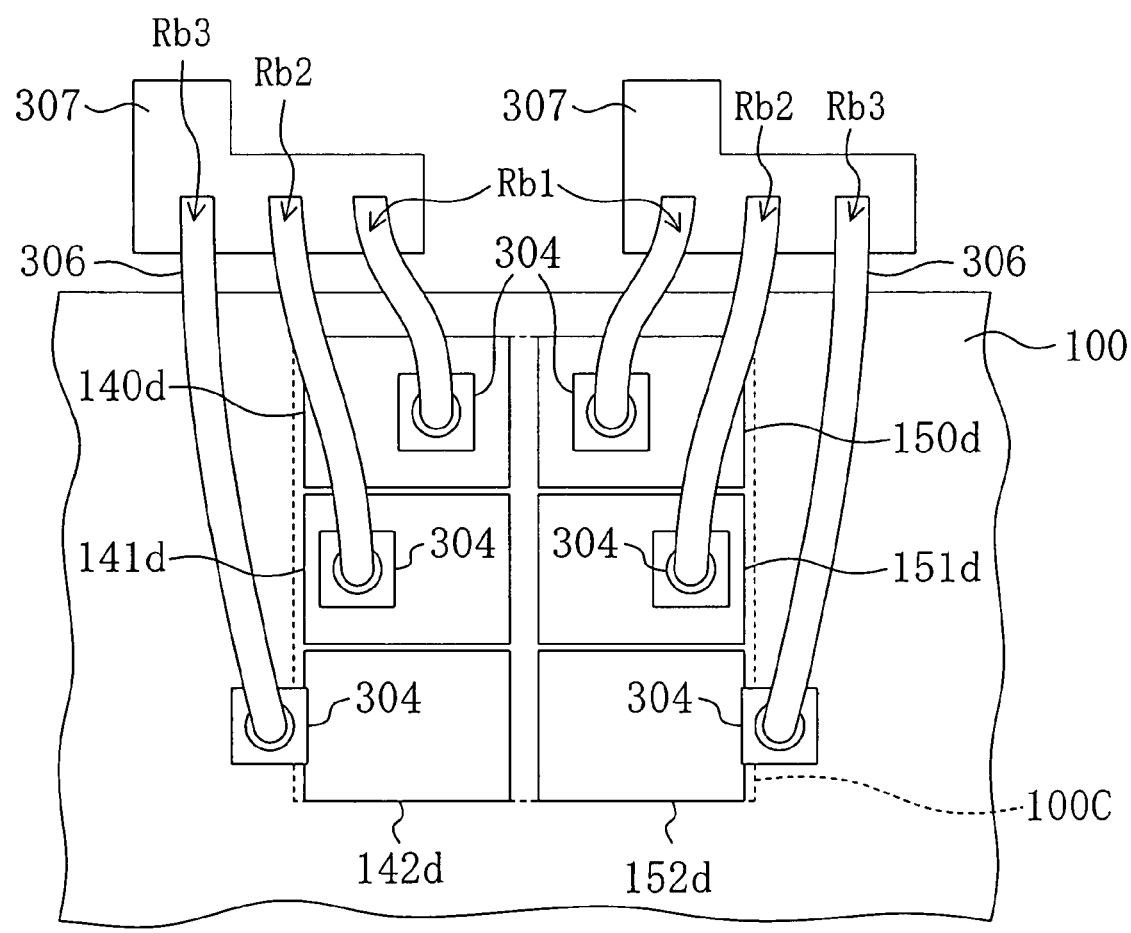
FIG. 8 is a simplified plan view showing schematically a part of an IC chip, which is an important part of the semiconductor integrated circuit according to a second modified example of the first embodiment of the present invention having such a structure that each one contact pad is disposed on each of six bus metal layers divided evenly, and a pad right above the device is protruded wholly from a bus right below the pad.

FIG. 7 and FIG. 8 show simplified plan view for the second modified example in the semiconductor integrated circuit according to the first embodiment of the present invention. Similarly, the first modified example is applicable to both semiconductor integrated circuits shown in FIG. 1 through FIG. 3, and the following description explains a case where it is applied to the semiconductor integrated circuit shown in FIG. 2 as the second modified example.

The second modified example shown in FIG. 6 and FIG. 7 is different from the semiconductor integrated circuit shown in FIG. 2 in that, when active regions 100B and 100C of the power transistor are narrow, and area of each of the buses 140c and 140d, 141c and 141d, 142c and 142d, 150c and 150d, 151c and 151d, 152c and 152d formed thereon is small as shown in FIG. 7 and FIG. 8, the contact pad 304, which is formed on the buses 142c and 152c, 142d and 152d located farthest away from the lead frame 307 side, is formed so that it is protruded in part or wholly. Other compositions are identical with the semiconductor integrated circuits shown in FIG. 1 through FIG. 3.

With this configuration, it is possible to obtain effects when the six buses 140 to 142, 150 to 152 are formed so as to have different area from each other as getting away from the lead frame 307, while contact of bonding wires 306 themselves is prevented and short circuit across outputs is prevented, which is explained using FIG. 1 and FIG. 3, and effects when the six buses 140 to 142, 150 to 152 are formed so as to have nearly even area, which is explained using FIG. 2.

Meanwhile, due to bonding wire technology developed in recent years, manufacturing of reliable ball contacts, long wires, and strictly controlled wire loop configurations are now made available. For example, it is possible to manufacture wire loops with accurately defined shape by moving a capillary in the air as predetermined by computer control, and loop pathway in round, trapezoidal, linear, or specifically specified configurations can be manufactured, and hence, the semiconductor integrated circuit according to the present embodiment mentioned above is used more usefully.

Second Embodiment

The following description explains, as a semiconductor integrated circuit according to the second embodiment of the present invention, an example where the semiconductor integrated circuit explained in the aforementioned first embodiment is actually applied to transistors, which will be described later, and also explains a modified example of the contact pad and connecting member. Since contents explained in the first embodiment are identical in the present embodiment, explanation thereof will be omitted.

First Example

The first example in the second embodiment of the present invention is an example where a DMOS transistor is applied to the semiconductor integrated circuit according to the aforementioned first embodiment.

Figure 9:
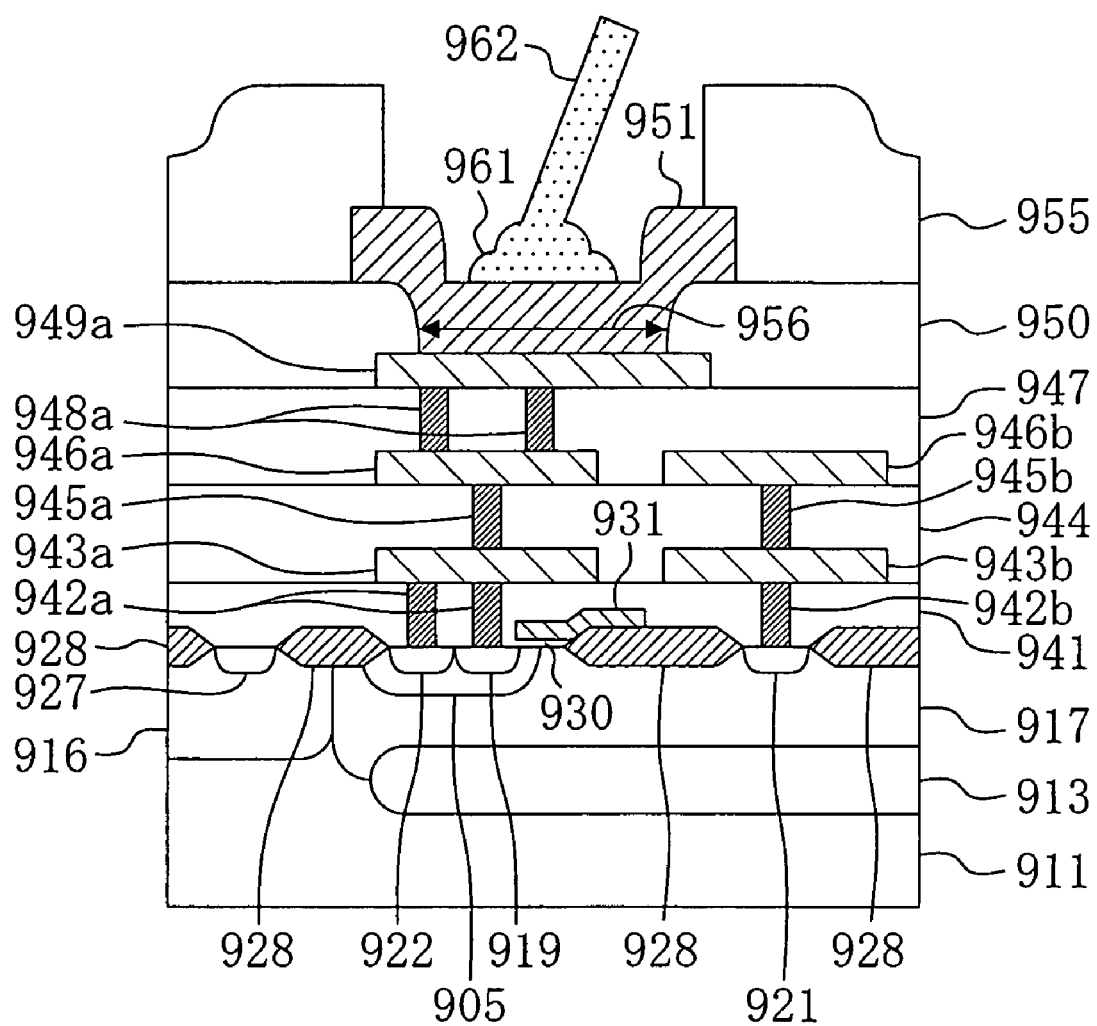
FIG. 9 is a simplified sectional view showing an important part of an integrated DMOS transistor which is the semiconductor integrated circuit according to a first example in a second embodiment of the present invention.

FIG. 9 is a simplified sectional view for explanation of composition of the semiconductor integrated circuit of the first example in the second embodiment of the present invention and a method for manufacturing the semiconductor integrated circuit.

As shown in FIG. 9, a DMOS transistor is formed on a p-type silicon substrate 911 by a well-known method. Namely, a DMOS transistor including an n-type buried region 913, an n-type well region 917, a body region 905, a source region 919, a drain contact region 921, a back gate region 922, a gate oxide 930, and a polysilicon gate 931 is formed. Meanwhile, a p-type well 916 is formed on the p-type silicon substrate 911 to be situated next to the n-type well region 917, and a substrate contact region 927 is formed to the p-type well 916. Further, an element separation insulator 928 is formed so as to define element formation regions on the p-type silicon substrate 911.

Subsequently, after the first interlevel insulator layer 941 is deposited onto whole area of the p-type silicon substrate 911 so as to cover the aforementioned DMOS transistor or the like, the first via 942a in which lower end reaches the back gate region 922 and the source region 919, and the first via 942b in which lower end reaches the drain region 921 are formed to the first interlevel insulator layer 941 using photolithographic technique and etching technique.

Next, after metal layer (first metal layer) is deposited on a first interlevel insulator layer 941, a first metal layer 943a (first metal pattern: first layer bus) in which lower face is connected with the upper end of a first via 942a, and a first metal layer 943b (second metal pattern: first layer bus) in which lower face is connected with the upper end of a first via 942b are formed, by patterning by etching. With these features, the first metal layer 943a functions as the source electrode of the transistor and the first metal layer 943b functions as the drain electrode of the transistor.

Subsequently, after a second interlevel insulator layer 944 is deposited on the first interlevel insulator layer 941 so as to cover the first metal layers 943a and 943b, a second via 945a in which lower end reaches the first metal layers 943a and second via 945b in which lower end reaches the first metal layer 943b are formed on the second interlevel insulator layer 944 using photolithographic technique and etching technique.

Subsequently, after a metal layer (second metal layer) is deposited on the second interlevel insulator layer 944, a second metal layer 946a (first metal pattern: second layer bus) in which lower face is connected with the upper end of the second via 945a, and a second metal layer 946b (second metal pattern: second layer bus) in which lower face is connected with the upper end of the second via 945b are formed, by patterning by etching. With these features, the second metal layer 946a functions as extension of the source electrode of the transistor, and the second metal layer 946b functions as extension of the drain electrode of the transistor.

Subsequently, after a third interlevel insulator layer 947 is deposited on the second interlevel insulator layer 944 so as to cover the second metal layers 946a and 946b, a third via 948a in which lower end reaches the first metal layer 946a is formed on the third interlevel insulator layer 947 using photolithographic technique and etching technique. Meanwhile, a plurality of third vias 948a is electrically connected with the source electrode of the transistor, and, although not shown, a plurality of vias electrically connected with the drain electrode of the transistor are formed similarly.

Subsequently, after metal layer (third metal layer) is deposited on the third interlevel insulator layer 947, a third metal layer 949a (third layer bus) in which lower face is connected with the upper end of a third via 948a is formed, by patterning by etching. The third metal layer 949a electrically connected with the second metal layer 946a and the first metal layer 943a functions as a bus for the source electrode of the transistor. Although not shown, the third via and the third metal layer electrically connected with the second metal layer 946b and the first metal layer 943b are formed similarly, and they function as a bus for the drain electrode of the transistor.

Subsequently, after a fourth interlevel insulator layer 950 is deposited on the third interlevel insulator layer 947 so as to cover the third metal layers 949a and the third metal layer (not shown), an opening 956 is formed to the fourth interlevel insulator layer 950 using photolithographic technique and etching technique. In this way, the opening 956 is formed to be positioned at least one vertically upwardly above the third via 948a which electrically connects the third metal layer 949a to the source electrode, and similarly, an opening (not shown) is formed to be positioned at least one vertically upwardly above the third via which electrically connects the third metal layer to drain.

Subsequently, after a metal layer having film thickness more than twice the film thickness of the third metal layer 949a is formed on the opening 956 which exposes the third metal layer 949a, a contact pad 951 having film thickness more than twice the film thickness of the third metal layer 949a is formed by patterning by etching. In this way, connection of the contact pad 951 and the third metal layer 949a as the third layer bus is performed at the contact pad 951 portion positioned at lower part in the opening 956, namely, by single via. Meanwhile, diameter of the single via is preferably more than 50 μm. Following this, after a protective covering layer 955 is deposited on the fourth interlevel insulator layer 950 and the contact pad 951, an opening for exposing the contact pad 951 is formed by patterning by etching, and a ball 961 and a bonding wire 962 are formed on the contact pad 951. In FIG. 8, the contact pad 951 is provided to the third metal layer 949a which functions as a source bus and a contact pad is also provided to the third metal layer (not shown) similarly which functions as a drain bus.

As discussed above, according to the first example in the second embodiment of the present invention, when the first through the third metal layers 943a, 946a, and 949a as a bus for the first layer through the third layer, and the contact pad 951 are arranged right above the DMOS transistor, integration degree of ICs is improved, and saving of chips is made possible. Further, when the third metal layer 949a (including the third metal layer (not shown)) as the third layer bus is formed at least one vertically upwardly above the third via 948a (including the third metal layer (not shown)), and the contact pad 951 having film thickness more than twice the film thickness of the third layer bus is formed to the opening 956 which exposes the third metal layer 949a, ON resistance can be reduced, speeding up and lower power consumption can be attained and at the same time, stress at wire bonding is absorbed and crack occurrence can be reduced.

Although a case where semiconductor integrated circuit is of N-channel type DMOS transistor is explained in the present embodiment, the same also applies to P-channel type DMOS transistor, and it is not limited to the aforementioned structure as long as connection with wiring metal layer is similar.

First Modified Example in First Example

A first modified example in the first example of the present embodiment is an example where DMOS transistor integrated on SOI substrate is applied to the semiconductor integrated circuit according to the aforementioned first example.

Figures 10A, 10B:
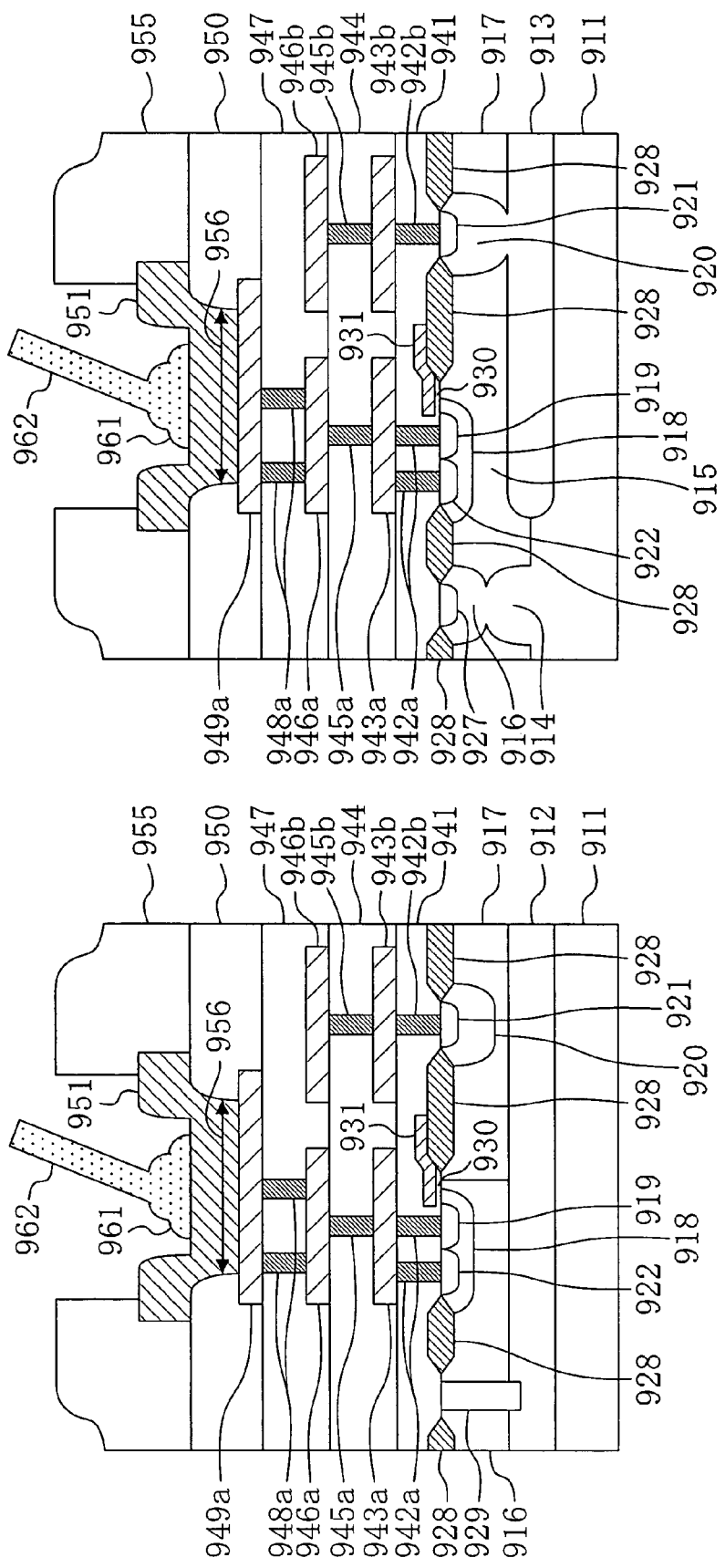
FIG. 10(a) is a simplified sectional view showing an important part of a DMOS transistor integrated on the SOI substrate which is the semiconductor integrated circuit according to the first modified example of the first example in the second embodiment of the present invention, and 10(b) is a simplified sectional view showing schematically an important part of a DMOS transistor integrated on the epitaxial substrate which is the semiconductor integrated circuit according to the second modified example of the first example in the second embodiment of the present invention.

FIG. 10(a) is a simplified sectional view for explanation of composition of the semiconductor integrated circuit of the first modified example in the first example of the present embodiment and a method for manufacturing the semiconductor integrated circuit. This modified example is different from composition and a method for manufacturing the first example shown in FIG. 9 in that a DMOS transistor is integrated on SOI substrate, and other composition and a manufacturing method are similar.

As shown in FIG. 10(a), DMOS transistor is formed on the p-type silicon substrate 911 and a buried insulator layer 912 by well-known method. Namely, DMOS transistor including the p-type well region 916, the n-type well region 917, a body region 918, the source region 919, a drain region 920, the drain contact region 921, the back gate region 922, the gate oxide 930, and the polysilicon gate 931 is formed. Meanwhile, a trench separation insulator layer 929 is formed to a part of the p-type silicon substrate 911 and to the p-type well region 916.

As discussed above, according to the first modified example in the first example of the present embodiment, when SOI substrate is used as semiconductor substrate in addition to effects of the aforementioned first example, perfect separation is made possible, erroneous operations such as latch and parasitism hardly occur and reliability can be improved.

Second Modified Example in First Example

The second modified example in the first example of the present embodiment is an example where DMOS transistor integrated on the epitaxial substrate is applied to the semiconductor integrated circuit according to the aforementioned first example.

FIG. 10(b) is a simplified sectional view for explanation of composition of the semiconductor integrated circuit of the second modified example in the first example of the present embodiment and a method for manufacturing the semiconductor integrated circuit. This modified example is different from composition and a method for manufacturing the first example shown in FIG. 8 in that DMOS transistor is integrated on epitaxial substrate, and other composition and a manufacturing method are similar.

As shown in FIG. 10(b), DMOS transistor is formed on the p-type silicon substrate 911 by well-known method. Namely, DMOS transistor including the n-type buried region 913, an epitaxial region 915, the body region 918, the source region 919, the drain region 920, the drain contact region 921, the back gate region 922, the gate oxide 930, and the polysilicon gate 931 is formed. Meanwhile, a p-type buried region 914 and the p-type well region 916 are formed so as to be situated next to the epitaxial region 915.

As discussed above, according to the second modified example in the first example of the present embodiment, in addition to effects by the aforementioned first example, when epitaxial substrate is used as the semiconductor substrate, improvement of current capability of the power transistor is possible.

Third Modified Example in First Example

The third modified example in the first example of the present embodiment is an example where the semiconductor integrated circuit according to the aforementioned first example is applied to a DMOS transistor, and connection of the contact pad and the third layer bus is carried out by a plurality of vias.

Figure 11A:
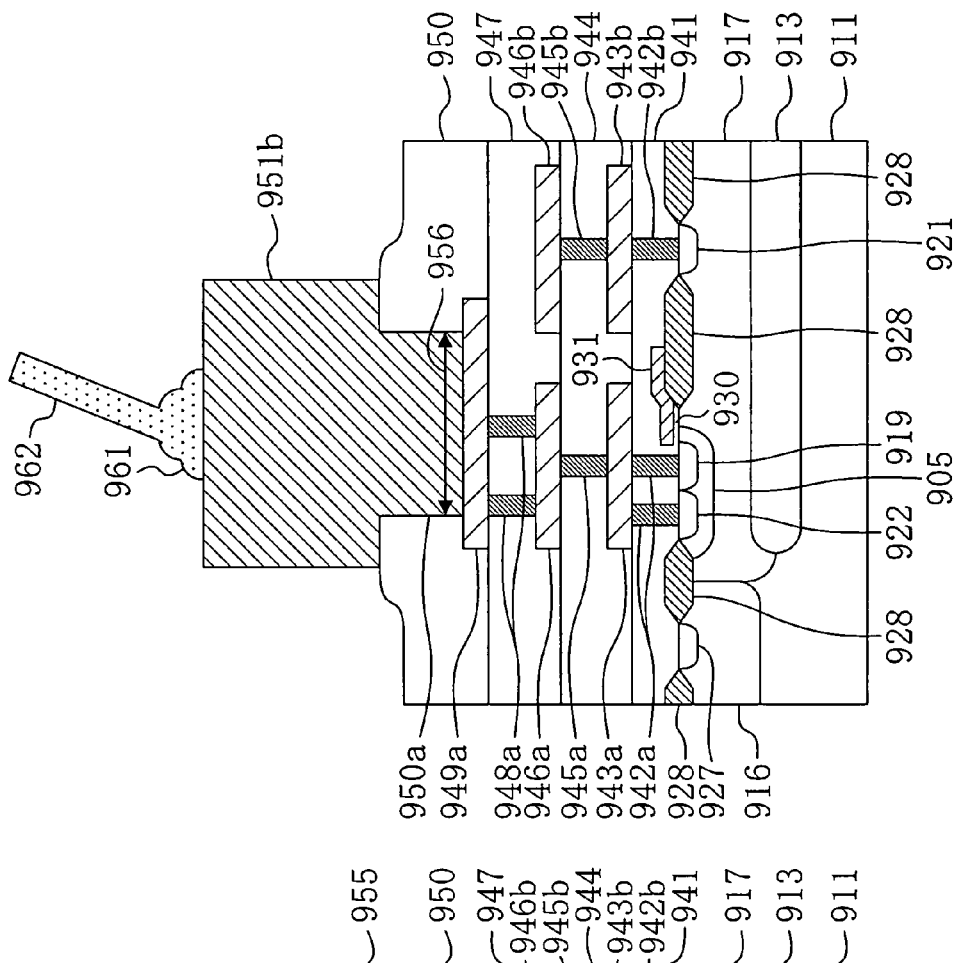
FIG. 11(a) is a simplified sectional view showing an important part of an integrated DMOS transistor which is the semiconductor integrated circuit according to a third modified example of the first example in the second embodiment of the present invention having such a structure that the contact pad and the third layer bus are connected by a plurality of vias, and 11(b) is a simplified sectional view showing schematically an important part of an integrated DMOS transistor which is the semiconductor integrated circuit according to a fourth modified example of the first example in the second embodiment of the present invention having such a structure that the contact pad is formed by the plating method.

FIG. 11(a) is a simplified sectional view for explanation of composition of the semiconductor integrated circuit of the third modified example in the first example of the present embodiment and a method for manufacturing the semiconductor integrated circuit. This modified example is different from the composition and a method for manufacturing the first example shown in FIG. 8 in that connection of the contact pad and the third layer bus is carried out by a plurality of vias, and other composition and a manufacturing method are similar. Namely, with the composition shown in FIG. 8, connection of the contact pad and the third layer bus is carried out by single via.

In this modified example, as shown in FIG. 11(a), as connection of the third metal layer 949a and the contact pad 951, a plurality of via arrays 950a provided passed through the fourth interlevel insulator layer 950 are used at the position corresponding to the opening 956 shown in FIG. 9.

As discussed above, according to the third modified example in the first example of the present invention, in addition to effects by the aforementioned first example, it is possible to absorb stress at wire bonding and to reduce crack occurrence with use of a plurality of via arrays 950a.

Fourth Modified Example in First Example

The fourth modified example in the first example of the present embodiment is an example where a DMOS transistor is applied as the semiconductor integrated circuit according to the aforementioned first example and contact pad is formed by plating method.

Figure 11B:
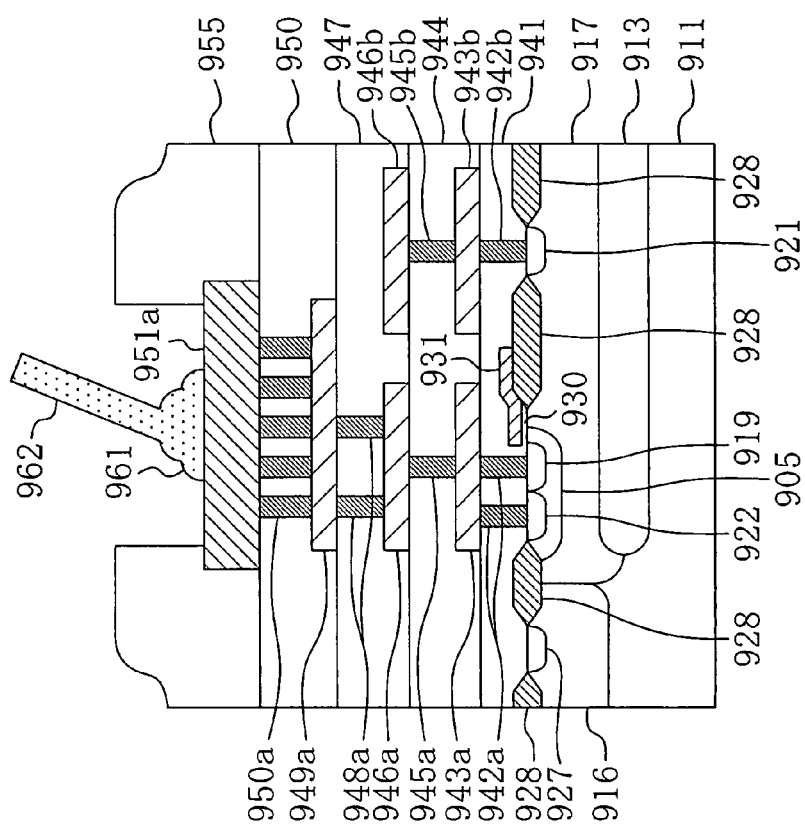

FIG. 11(b) is a simplified sectional view for explanation of composition of the semiconductor integrated circuit of the fourth modified example in the first example of the present embodiment and a method for manufacturing the semiconductor integrated circuit. This modified example is different from the composition and a method for manufacturing the first example shown in FIG. 9 in that contact pad is formed by plating method, and other composition and a manufacturing method are similar.

As shown in FIG. 11(b), a contact pad 951b is formed by plating method at the interior of the opening 956 which exposes the third metal layer 949a and on the fourth interlevel insulator layer 950.

As discussed above, according to the fourth modified example in the first example of the present embodiment, in addition to effects by the aforementioned first example, film thickening of the third metal layer 949a is made easy and therefore, speeding up and lower power consumption can be attained by reduction in ON resistance of the power transistor and at the same time, stress at wire bonding is absorbed and crack occurrence can be reduced.

Fifth Modified Example in First Example

The fifth modified example in the first example of the present embodiment is an example where a DMOS transistor is used as the semiconductor integrated circuit according to the aforementioned first example and solder ball is used as the connecting member.

FIG. 12(a) is a simplified sectional view for explanation of composition of the semiconductor integrated circuit of the fifth modified example in the first example of the present embodiment and a method for manufacturing the semiconductor integrated circuit. This modified example is different from the composition and a method for manufacturing the first example shown in FIG. 8 in that, as mentioned above, the ball 961 is used as the connecting member and solder ball is used in lieu of the bonding wire 962 (see FIG. 9), and other composition and a manufacturing method are similar.

As shown in FIG. 12(a), a solder ball 963 is formed at the interior of the third metal layer 949a and on the protective covering layer 955.

As discussed above, according to fifth modified example in the first example of the present embodiment, in addition to the aforementioned effects of the first example, chip size package can be used with the use of the solder ball 963 as the member for connecting to the contact pad 951, and hence, downsizing of IC package size can be attained.

Sixth Modified Example in First Example

The sixth modified example in the first example of the present embodiment is an example where a DMOS transistor is applied as the semiconductor integrated circuit according to the aforementioned first example and plated metal layer is used as the connecting member.

FIG. 12(b) is a simplified sectional view for explanation of composition of the semiconductor integrated circuit of the fifth modified example in the first example of the present embodiment and a method for manufacturing the semiconductor integrated circuit. This modified example is different from the composition and a method for manufacturing the first example shown in FIG. 8 in that, as mentioned above, the ball 961 is used as the connecting member and plated metal layer is formed in lieu of the bonding wire 962 (see FIG. 9), and other composition and a manufacturing method are similar.

As shown in FIG. 12(b), a plated metal layer 964 is formed at the interior of the third metal layer 949a and on the protective covering layer 955.

As discussed above, according to the sixth modified example in the first example of the present embodiment, in addition to effects by the aforementioned first example, film thickening of the third metal layer 949a is made easy with the use of the plated metal layer 964 as the member for connecting to the contact pad 951, and therefore, speeding up and lower power consumption can be attained by reduction in ON resistance of the power transistor and at the same time, stress at wire bonding is absorbed and crack occurrence can be reduced.

Although a case where semiconductor integrated circuit is of N-channel type DMOS transistor is explained in the second through sixth modified examples in the first example, type and structure of the power transistor are not limited as long as connection with wiring metal layer is similar.

Second Example

The second example in the second embodiment of the present invention is an example where a CMOS transistor is applied to the semiconductor integrated circuit according to the aforementioned first embodiment.

Figure 13:
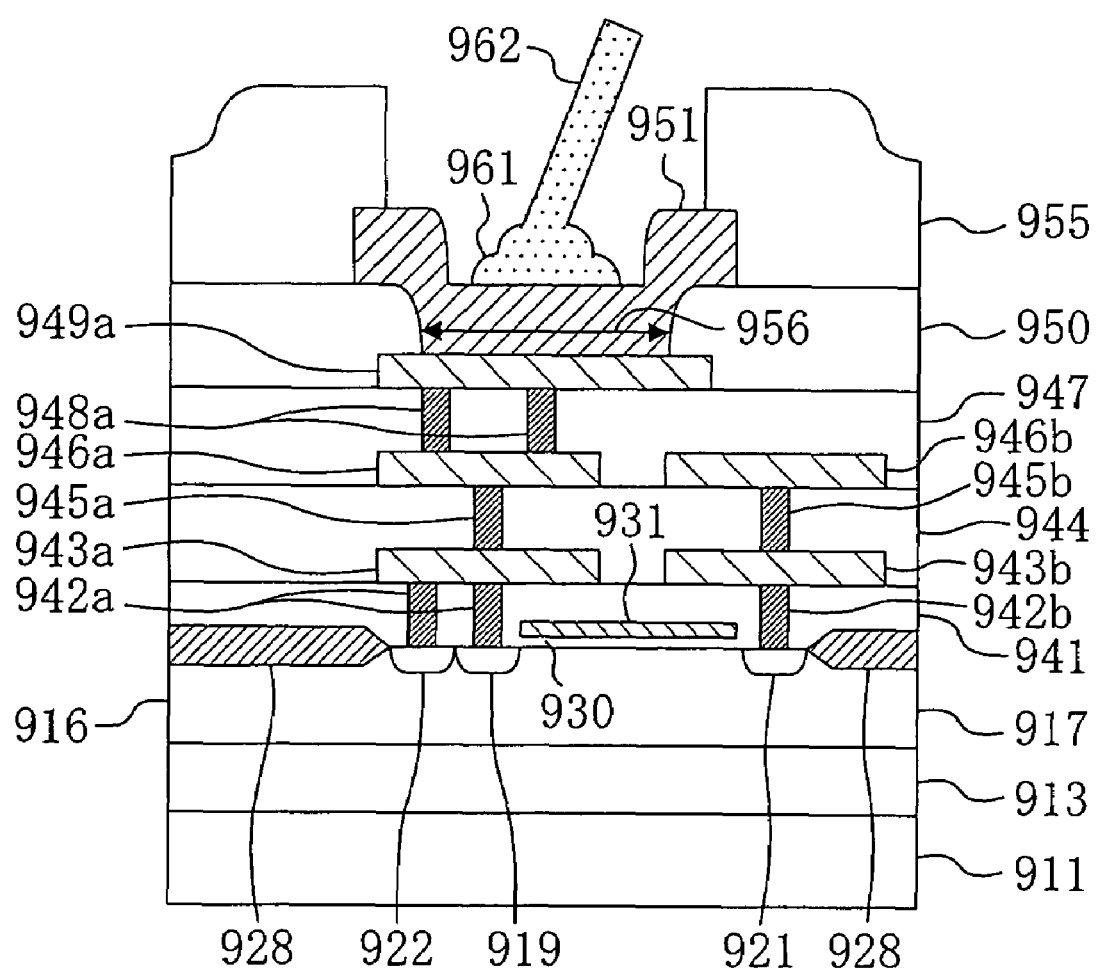
FIG. 13 is a simplified sectional view showing an important part of an integrated CMOS transistor which is the semiconductor integrated circuit according to the first example in the second embodiment of the present invention.

FIG. 13 is a simplified sectional view for explanation of composition of the semiconductor integrated circuit of the second example in the second embodiment of the present invention and a method for manufacturing the semiconductor integrated circuit. This example is different from the first example in which a DMOS transistor is integrated as shown in FIG. 8 in that a CMOS transistor is integrated, and other composition and a manufacturing method are similar.

As shown in FIG. 13, a CMOS transistor is formed on the p-type silicon substrate 911, the n-type buried region 913, the p-type well region 916 by well-known method. Namely, a DMOS transistor including the source region 919, the drain contact region 921, the back gate region 922, the gate oxide 930, and the polysilicon gate 931 is formed.

As discussed above, according to the second example in the second embodiment of the present invention, it is possible to obtain the same effects as is the case of a DMOS transistor in the first example. Namely, when the first through the third metal layers 943a, 946a, and 949a as the buses of the first layer through the third layer, and the contact pad 949a are arranged right above the CMOS transistor, integration degree of ICs is improved, and saving of chips is made possible. Further, when the third metal layer 946a as the third layer bus (including the third metal layer (not shown)) is disposed at least one vertically upwardly above the third via 948a (including the third metal layer (not shown)), and the contact pad 951 having film thickness more than twice the film thickness of the third layer bus is formed to the opening 956 which exposes the third metal layer 946a, ON resistance can be reduced, speeding up and lower power consumption can be attained and at the same time, stress at wire bonding is absorbed and crack occurrence can be reduced.

Although a case where semiconductor integrated circuit is of an N-channel type MOS transistor is explained in the second example of the present embodiment, a P-channel type MOS transistor may be used, and it is not limited to the aforementioned structure as long as connection with wiring metal layer is similar.

Third Example

The third example in the second embodiment of the present invention is an example where a bipolar transistor is applied to the semiconductor integrated circuit according to the aforementioned first embodiment.

Figure 14:
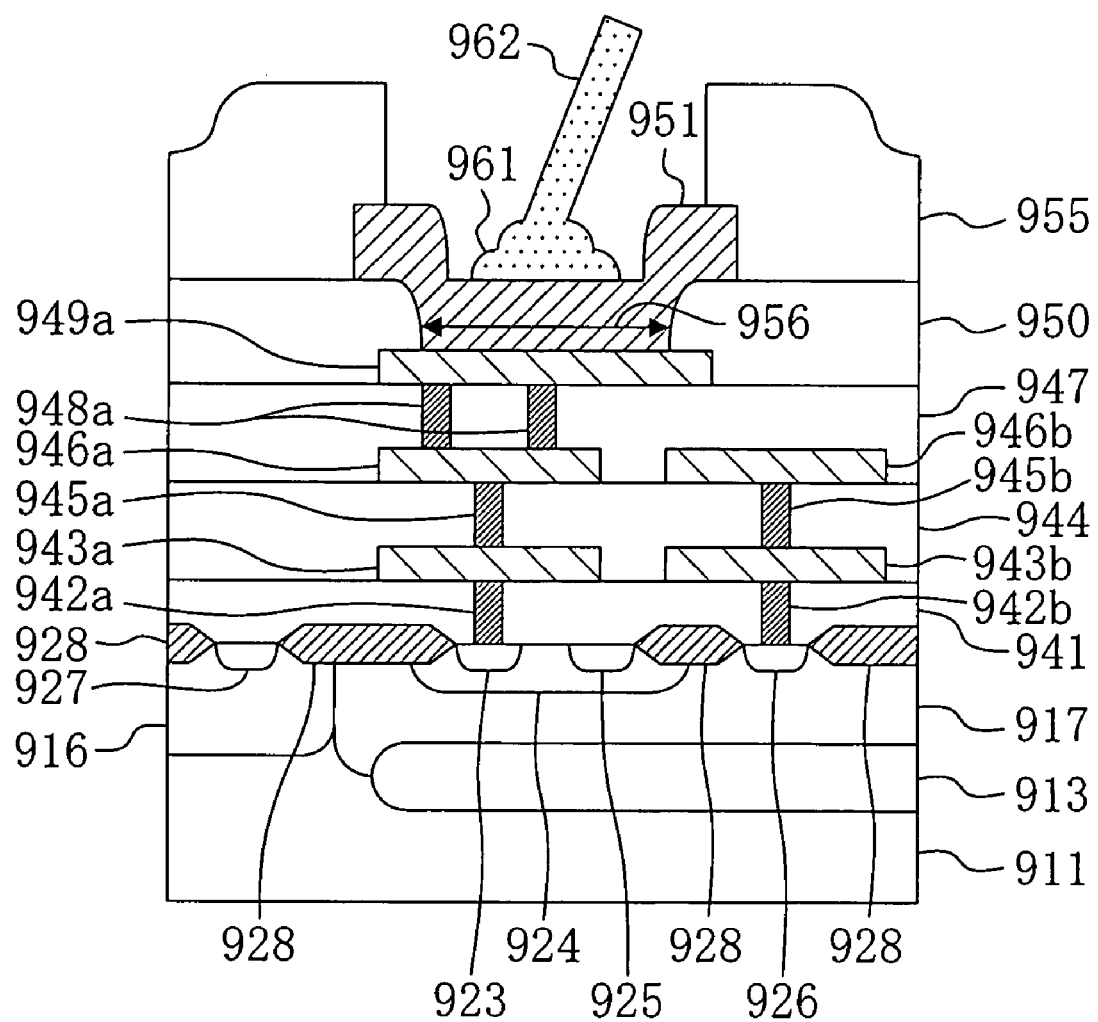
FIG. 14 is a simplified sectional view showing an important part of an integrated bipolar transistor which is the semiconductor integrated circuit according to the first example in the second embodiment of the present invention.

FIG. 14 is a simplified sectional view for explanation of composition of the semiconductor integrated circuit of the third example in the second embodiment of the present invention and a method for manufacturing the semiconductor integrated circuit.

As shown in FIG. 14, a bipolar transistor is formed on the p-type silicon substrate 911 by well-known method. Namely, a bipolar transistor including the n-type buried region 913, the n-type well region 917, an emitter region 923, a base region 924, a base contact region 925, and a collector contact region 926 is formed. Meanwhile, the p-type well 916 is formed to the p-type silicon substrate 911 to be situated next to the n-type well region 917, and the substrate contact region 927 is formed to the p-type well 916. Further, the element separation insulator layer 928 is formed so as to define element formation regions on the p-type silicon substrate 911.

Subsequently, after the first interlevel insulator layer 941 is deposited onto whole area of the p-type silicon substrate 911 so as to cover the aforementioned bipolar transistor or the like, the first via 942a in which lower end reaches the emitter region 923 and the first via 942b in which lower end reaches the collector region 926 are formed to the first interlevel insulator layer 941 using photolithographic technique and etching technique.

Subsequently, after a metal layer (first metal layer) is deposited on the first interlevel insulator layer 941, the first metal layer 943a (first metal pattern: first layer bus) in which lower face is connected with the upper end of the first via 942a, and the first metal layer 943b (second metal pattern: first layer bus) in which lower face is connected with the upper end of the first via 942b are formed by patterning by etching. With these features, the first metal layer 943a is electrically connected with the emitter region 923 to function as the emitter electrode of the transistor, and the first metal layer 943b is electrically connected with the collector contact region 926 to function as the collector electrode of the transistor.

Subsequently, after the second interlevel insulator layer 944 is deposited on the first interlevel insulator layer 941 so as to cover the first metal layers 943a and 943b, the second via 945a in which lower end reaches the first metal layers 943a, and the second via 945b in which lower end reaches the first metal layer 943b are formed to the second interlevel insulator layer 944 using photolithographic technique and etching technique.

Subsequently, after a metal layer (second metal layer) is deposited on the second interlevel insulator layer 944, the second metal layer 946a (first metal pattern: second layer bus) in which lower face is connected with the upper end of the second via 945a, and the second metal layer 946b (second metal pattern: second layer bus) in which lower face is connected with the upper end of the second via 945b are formed by patterning by etching. With these features, the second metal layer 946a functions as extension of the emitter electrode of the transistor, and the second metal layer 946b functions as extension of the collector electrode.

Subsequently, after the third interlevel insulator layer 947 is deposited on the second interlevel insulator layer 944 so as to cover the second metal layers 946a and 946b, the third via 948a in which lower end reaches the second metal layer 946a is formed to the third interlevel insulator layer 947 using photolithographic technique and etching technique. Meanwhile, a plurality of the third vias 948a are electrically connected with the emitter electrode of the transistor, and although not shown, a plurality of vias electrically connected with the collector electrode of the transistor are formed similarly.

Subsequently, after a metal layer (third metal layer) is deposited on the third interlevel insulator layer 947, the third metal layer 949a (third layer bus) in which lower face is connected with the upper end of the third via 948a is formed by patterning by etching. The third metal layer 949a electrically connected with the second metal layer 946a and the first metal layer 943a functions as a bus for the emitter electrode of the transistor. Although not shown, the third via and the third metal layer electrically connected with the second metal layer 946b and the first metal layer 943b are formed similarly, and they function as a bus for the collector electrode of the transistor.

Subsequently, after the fourth interlevel insulator layer 950 is deposited on the third interlevel insulator layer 947 so as to cover the third metal layer 949a and third metal layer (not shown), the opening 956 is formed to the fourth interlevel insulator layer 950 using photolithographic technique and etching technique. In this way, the opening 956 is formed to be positioned at least one vertically upwardly above the third via 948a for electrical connection of the third metal layer 949a with the emitter electrode, and similarly, an opening (not shown) is formed to be positioned at least one vertically upwardly above the third via for electrical connection of the third metal layer with the collector electrode.

Subsequently, after a metal layer having film thickness more than twice the film thickness of the third metal layer 949a is deposited on the opening 956 which exposes the third metal layer 949a, the contact pad 951 having film thickness more than twice the film thickness of the third metal layer 949a is formed by patterning by etching. Following this, after the protective covering layer 955 is deposited on the fourth interlevel insulator layer 950 and the contact pad 951, an opening which exposes the contact pad 951 is formed by patterning by etching, and the ball 961 and the bonding wire 962 are formed on the contact pad 951. Meanwhile, in FIG. 14, the contact pad 951 is provided to the third metal layer 949a functioning as the emitter bus, and the contact pad is provided similarly to the third metal layer functioning as the emitter bus, although not shown.

As discussed above, according to the second example in the second embodiment of the present invention, same effects by the first example using a DMOS transistor as the power transistor are obtainable even in the present example using a bipolar transistor as the power transistor. Namely, when the first through third metal layers 943a, 946a, and 949a as the first layer through the third layer buses, and the contact pad 951 are disposed right above the bipolar transistor, integration degree of ICs is improved, and saving of chips is made possible. Further, when the third metal layer 949a as the third layer bus (including the third metal layer (not shown)) is disposed at least one vertically upwardly above the third via 948a (including the third metal layer (not shown)), and the contact pad 951 having film thickness more than twice the film thickness of the third layer bus is formed to the opening 956 which exposes the third metal layer 949a, ON resistance can be reduced, speeding up and lower power consumption can be attained and at the same time, stress at wire bonding is absorbed and crack occurrence can be reduced.

Although an example where semiconductor integrated circuit is of an NPN transistor is explained in the second example of the present embodiment, a PNP transistor may be used, and it is not limited to the aforementioned structure as long as connection with wiring metal layer is similar.

Further, the first through the fifth modified examples explained in the aforementioned first example can be applied similarly to the second and the third examples of the present embodiment.

Further, it should be noted that in the aforementioned first and second embodiments, arrangement of the contact pad 951 may be used for improvement of dissipation of heat energy emitted from active parts of IC. This is particularly true for a case when bump is employed for the purpose of minimizing thermal resistance and thermal pathway for heat dissipation as connection means to the outside.

Further, for the first interlevel insulator layer 941, the second interlevel insulator layer 944, the third interlevel insulator layer 947, and the fourth interlevel insulator layer 950, for example, nitride, oxide, combination of nitride/oxide, SOG, BPSG, or lower dielectric constant gel or the like may be used, and material and thickness are not particularly limited.

Further, for the protective covering layer 955, for example, silicon nitride, silicon acid nitride, silicon/carbon alloy, combination of oxide/nitride, polyimide, and sandwich structure thereof may be used as long as it is mechanically strong and electrically insulated to prevent penetration of moisture, and material and thickness are not particularly limited.

Similarly, for the first metal layers (first layer bus) 943a and 943b, the second metal layers (second layer bus) 946a and 946b, the third metal layer (third layer bus) 949a, and the contact pad 951 (304), for example, metals such as aluminum, copper or the like, or metal alloy may be used, and material and thickness are not particularly limited.

Although, as composition of the bus, explanation is given for a case where metal layer (bus) of three layers, namely, the first metal layers 943a and 943b, the second metal layers 946a and 946b, the third metal layer 949a are formed, the composition may be single layer or two-layer metal layer (bus), or metal layer (bus) more than three layers. Further, pattern formation of these metal layers (bus) is not limited to etching, and damascene method, by which a groove is formed between interlevel insulator layers and metal material is buried, or the like may be employed.

Further, it should not be construed that the present invention is limited to the aforementioned explanations for each of the embodiments. It is apparent for those skilled in the art that, by referring to the present explanation, various modifications and combinations to exemplary embodiments are possible together with other embodiments of the present invention. As one example, the present invention includes the contact pads located above active parts, and generally covers a semiconductor integrated circuit in which position of these pads is selected so as to control and to distribute electric power to active parts disposed under the pads. As another example, the present invention includes the contact pads located above active parts, and covers a semiconductor ICs disposed so as to minimize a distance for electric power distribution between one pad selected and active parts corresponding to one or a plurality of pads to which electric power should be supplied. Therefore, the scope of appended claims can include all of these modifications and embodiments.

Further, the semiconductor integrated circuit according to the present invention and a method for manufacturing the semiconductor integrated circuit contribute to simultaneous pursuit of lower power consumption and improvement of reliability with regard to performances of core semiconductor electronic parts such as power supply, motor driver, or audio amplifier through utilization of technology of pads right above the device and ingenuity of power integration circuit performing wire bonding right above active circuit region part. Therefore, the present invention, which utilizes existing facilities in the manufacture, is realized easily and with low costs and is extremely useful for less expensive, high-grade and high-performance power integrated circuit.

What is claimed is:

1. A semiconductor integrated circuit comprising:
   an integrated power transistor formed on a semiconductor substrate;
   an interlayer insulation film formed on the power transistor;

a plurality of first metal patterns which comprise a first metal layer formed right above the power transistor, in the interlayer insulation film, and function as a first electrode of the power transistor;

a plurality of second metal patterns which comprise the first metal layer and function as a second electrode of the power transistor;

a plurality of first buses which comprise a second metal layer formed right above the first metal layer, in the interlayer insulation film, and are electrically connected with, of a plurality of the first metal patterns, a corresponding first metal pattern; and a plurality of second buses which comprise the second metal layer and are electrically connected with, of a plurality of the second metal patterns, a corresponding second metal pattern, wherein one contact pad is provided to each of a plurality of the first buses and each of a plurality of the second buses.

2. The semiconductor integrated circuit according to claim 1, wherein:

each of a plurality of the first buses has the same surface area; and each of a plurality of the second buses has the same surface area.

3. The semiconductor integrated circuit according to claim 1, wherein:

each of a plurality of the first buses has a different surface area, and each of a plurality of the second buses has a different surface area.

4. The semiconductor integrated circuit according to claim 1, wherein the power transistor is divided into a plurality of members by a separating layer so as to correspond to each of a plurality of the first buses and each of a plurality of the second buses.

5. The semiconductor integrated circuit according to claim 1, wherein size of the power transistor in plan view is larger than the size of each of the contact pads.

6. The semiconductor integrated circuit according to claim 5, wherein each of the contact pads is, in plan view, included in a region in which the power transistor is formed.

7. The semiconductor integrated circuit according to claim 5, wherein each of the contact pads is, in plan view, protruded in part from the region in which the power transistor is formed.

8. The semiconductor integrated circuit according to claim 5, wherein each of the contact pads is, in plan view, protruded wholly from the region in which the power transistor is formed.

9. The semiconductor integrated circuit according to claim 1, wherein the power transistor is a DMOS transistor.

10. The semiconductor integrated circuit according to claim 1, wherein the power transistor is an insulated gate bipolar transistor.

11. The semiconductor integrated circuit according to claim 1, wherein the power transistor is a CMOS transistor.

12. The semiconductor integrated circuit according to claim 1, wherein the power transistor is a bipolar transistor.

13. The semiconductor integrated circuit according to claim 1, wherein the semiconductor substrate is an SOI substrate.

14. The semiconductor integrated circuit according to claim 1, wherein the semiconductor substrate is an epitaxial substrate.

15. The semiconductor integrated circuit according to claim 1, wherein thickness of each of the contact pads is more than twice the thickness of each of a plurality of the first buses and a plurality of the second buses.

16. The semiconductor integrated circuit according to claim 1, wherein connection between the contact pad and the first bus or the second bus is carried out through a single via.

17. The semiconductor integrated circuit according to claim 16, wherein diameter of the single via is 50 μm or more.

18. The semiconductor integrated circuit according to claim 1, wherein connection between the contact pad and the first bus or the second bus is carried out through a plurality of via arrays.

19. The semiconductor integrated circuit according to claim 1, wherein a plurality of the first buses and a plurality of the second buses are formed in increasing order of area from a position closer to an external connection member including at least a lead frame to a position away therefrom.

20. The semiconductor integrated circuit according to claim 1, wherein a plurality of the first buses and a plurality of the second buses are formed in descending order of area from a position closer to an external connection member including at least a lead frame to a position away therefrom.

21. The semiconductor integrated circuit according to claim 1, further comprising a connection member mounted to each of the contact pads.

* * * * *